United States Patent [19]
Sasaki et al.

[11] Patent Number: 5,126,974
[45] Date of Patent: Jun. 30, 1992

[54] SENSE AMPLIFIER FOR A MEMORY DEVICE

[75] Inventors: Katsuro Sasaki, Fuchu; Katsuhiro Shimohigashi, Musashimurayama; Koichiro Ishibashi, Tokyo; Shoji Hanamura, Kokubunji, all of Japan

[73] Assignee: Hitachi, Ltd., Tokyo, Japan

[21] Appl. No.: 465,040

[22] Filed: Jan. 16, 1990

[30] Foreign Application Priority Data

Jan. 20, 1989 [JP] Japan .................. 1-9726

[51] Int. Cl.⁵ .................. G11C 7/00; G11C 11/407
[52] U.S. Cl. .................. 365/207; 365/208; 365/189.01; 365/189.06; 307/530
[58] Field of Search .......... 365/189.01, 190, 207, 365/208, 154; 307/530

[56] References Cited

U.S. PATENT DOCUMENTS

| | | | |
|---|---|---|---|
| 4,335,449 | 1/1982 | Nokubo | 365/177 |
| 4,504,748 | 3/1985 | Oritani | 365/208 X |
| 4,670,675 | 6/1987 | Donoghue | 365/208 X |
| 4,697,112 | 9/1987 | Ohtani | 365/205 X |
| 4,829,479 | 5/1989 | Mitsumoto et al. | 365/208 X |
| 4,843,264 | 6/1989 | Galbraith | 365/207 X |
| 4,931,992 | 6/1990 | Ogihara et al. | 365/205 X |
| 4,962,324 | 10/1990 | Park | 365/208 X |
| 4,980,863 | 12/1990 | Ogihara | 365/205 |
| 5,023,841 | 6/1991 | Akrout | 365/205 |
| 5,910,711 | 3/1990 | Guo | 365/189.06 |

FOREIGN PATENT DOCUMENTS

52-8734 1/1977 Japan .

OTHER PUBLICATIONS

1984 IEEE International Solid-State Circuits Conference Digest of Technical Papers (ISSCC), pp. 214-215.
1984 ISSCC, pp. 222-223.
1985 ISSCC, pp. 62-63.
1985 ISSCC, pp. 58-59.
1985 ISSCC pp. 64-65.
1986 ISSCC pp. 204-205.
1987 ISSCC, pp. 132-133.
1987 ISSCC, pp. 264-265.
1988 ISSCC, pp. 174-175.

*Primary Examiner*—Alyssa H. Bowler
*Attorney, Agent, or Firm*—Fay, Sharpe, Beall, Fagan, Minnich & McKee

[57] ABSTRACT

A MOS transistor sense amplifier employs cross coupled positive feedback for the load circuit of a differential amplifier with an equalizing switch at the amplifier output, and preferably also at the input. This basis amplifier circuit may be repeated in stages. When stages are employed, it is desirable that the first stage employs current mirror loading of the differential amplifier to reduce the data delay. Data delay is further reduced by providing strong amplification during the sense portion of the read cycle with a preamplifier, which preamplifier has its amplification reduced, preferably to unity by being turned off, when the sense portion of the cycle is finished, and most preferably when the input and output data lines are directly connected independently of the preamplifier, so that the preamplifier may be completely turned off to lower power consumption.

71 Claims, 16 Drawing Sheets

SENSE AMPLIFIER FOR A MEMORY DEVICE

BACKGROUND

The present invention relates to a memory device, i.e., to a semiconductor integrated circuit in which the memory cells are integrated. More specifically, the invention relates to a sense amplifier circuit technology integrated with the memory cells to amplify a pair of complementary signals having a minute potential difference and read out from a memory cell.

As used in this application, inversion refers to the change of a data line from one of a high and low to the other of a high and low in adjacent read cycles, that is, the signal on the data line inverts from one read cycle to the next.

A conventional sense circuit for amplifying a read out signal from a memory cell has been disclosed in Japanese Laid-Open Patent Specification No. 52-8734 as shown in FIG. 3, in which complementary pair input signals d, dNOT are connected to the gate and drain of two cross-coupled driver MOS transistors, Q13 and Q14 in a sense amplifier circuit with load MOSFET's $Q_{11}$ and $Q_{12}$, and the drains of the above two driver MOS transistors $Q_{13}$ and $Q_{14}$ respectively serve as complementary pair output signals D, DNOT.

Further, according to U.S. Pat. NO. 4,335,449, as shown in FIG. 4, there are two cross-coupled load MOS transistors $Q_{21}$ and $Q_{22}$ connected to bipolar drive transistors $Q_{23}$ and $Q_{24}$ that receive complementary pair input signals d, dNOT connected to the base. The two driver bipolar transistors $Q_{23}$ and $Q_{24}$ have emitters connected through transistor $Q_{25}$ under control of signal SAC and through MOSFET $Q_{26}$ to ground.

SUMMARY

In the above Japanese Laid-Open Patent Specification No. 52-8734 (see FIG. 3), complementary pair input signals d, dNOT are connected to both the gate and drain of driver MOS transistors $Q_{13}$ and $Q_{14}$ in the sense amplifier circuit, and the input signal lines d, dNOT and the output signal lines D, DNOT are coupled directly. The present inventors, however, have found through their own study that when the output signal lines D, DNOT have very large capacitive loads, the signals cannot be amplified at high speeds and that the inversion of the complementary pairs of input signals and the inversion of the output signals are delayed due to positive feedback operation.

In the above U.S. Pat. No. 4,335,449 (see FIG. 4), capacitive loads of the output signals lines are driven using bipolar transistors $Q_{23}$ and $Q_{24}$. When a potential difference is small between complementary pair of input signals d, dNOT, the bipolar transistors $Q_{23}$, $Q_{24}$ and the load MOS $Q_{21}$, $Q_{22}$ can not be inverted in response to a minute input signal, because the operating currents of the bipolar transistors $Q_{23}$, $Q_{24}$ responding to a difference in this input potential are small in comparisons with positive feedback holding currents flowing into the cross-coupled load MOS transistors $Q_{21}$, $Q_{22}$. That is, the present inventors have discovered that a circuit constructed according to this U.S. Patent cannot carry out high-speed sense operation for minute input signals. As a part of the present invention, the use of MOS transistors in place of bipolar transistors $Q_{23}$ and $Q_{24}$ were considered, but such a circuit would not work, because MOS technology cannot produce the current and voltage necessary to overcome the prior condition of the cross-coupled positive feedback circuit for an inversion.

An object of the present invention, therefore, is to provide a sense amplifier circuit that can operate at high speeds free of the defects inherent in the above-mentioned prior art.

In order to carry out the high-speed sensing operation for the minute input signals read out from the memory cells, a first switching means is connected across the differential outputs of the differential MOS transistors connected to load MOS transistors of which the gates and drains are cross-coupled to each other. When the differential transistors are inverted in response to the read out signal, the first switching means is rendered conductive by a first control signal and is then rendered non-conductive.

When the first switching means is rendered conductive by the first control signal, the positive feedback holding operation of the cross-coupled load MOS transistors is dissolved. In response to a subsequent minute input signal, therefore, the differential transistors can carry out a high speed inverting operation.

A multi-stage amplifier circuit is constituted in which the preamplifier and the sense amplifier, integrated with the memory cells, are placed in an activated condition to start the operation for reading out the signals from the memory cells, the complementary signals read out from the memory cells are amplified through the pre-amplifier, the complementary amplified output signals of the preamplifier are further amplified through a sense amplifier in a succeeding stage, and heavy load capacitances in the output signal lines of the sense amplifier are driven by the complementary output signals of the sense amplifier. The pre-amplifier circuit has a circuit form in which the input signal line and the output signal line are coupled directly when the pre-amplifier is nonactive. When the amplification operation of the sense amplifier in the succeeding stage has almost finished (when a predetermined period of time has passed after it is started to read out the signals from the memory cells), the preamplifier in the preceding stage is placed in a non-activated condition, and the sense amplifier in the succeeding stage is kept in an activated condition.

When the amplification operation of the sense amplifier in the succeeding stage has finished, the pre-amplifier in the preceding stage is placed in a non-activated condition. Therefore, a potential difference in the complementary outputs of the sense amplifier do not increase excessively, and the next inverting read out operation is executed at a high speed. Further, even when the pre-amplifier is placed in a non-activated condition, the signal read out from the memory cell is transmitted for amplification to the input of the activated sense amplifier via the direct path between the input signal line and the output signal line of the pre-amplifier. Therefore, the disappearance of amplified output of the sense amplifier can be avoided.

BRIEF DESCRIPTION OF THE DRAWINGS

Further objects, features and advantages of the present invention will become more clear from the following detailed description of a preferred embodiment, shown in the drawing, wherein.

DETAILED DESCRIPTION OF THE DRAWINGS

Figure 1:
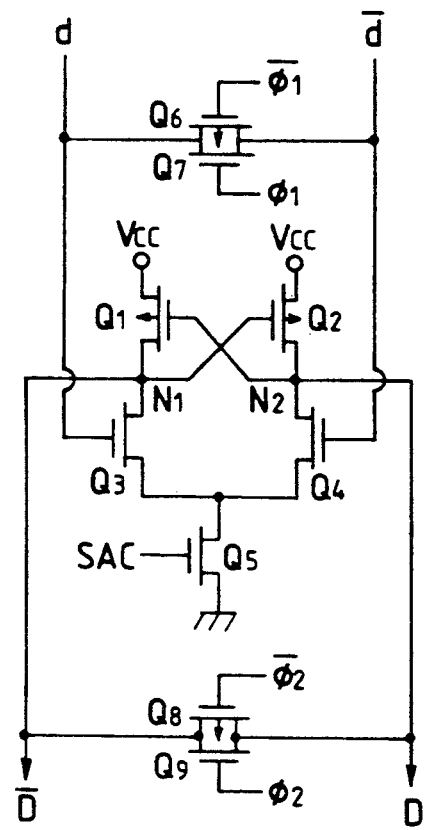
FIG. 1 is a circuit diagram of an embodiment of the present invention.

An embodiment of the invention will now be described in conjunction with FIG. 1. Symbols $Q_1$, $Q_2$, $Q_6$ and $Q_8$ denote p-channel MOS transistors (hereinafter referred to as pMOS's); symbols $Q_3$, $Q_4$, $Q_5$, $Q_7$ and $Q_9$ denote n-channel MOS transistors (hereinafter referred to as nMOS's); symbols d and dNOT denote a pair of complementary signals input to a sense circuit of this embodiment and complementary read out signals are transmitted from a memory cell; symbols D, DNOT denote a pair of complementary signals produced from the sense circuit; symbols $\phi_1$NOT, $\phi_1$, $\phi_2$NOT and $\phi_2$ denote pulse signals for driving the transistors $Q_6$, $Q_7$, $Q_8$ and $Q_9$; and SAC denotes a sense amplifier activation signal applied to the gate terminal of nMOS $Q_5$. The timings of these signals are shown in FIG. 2. The pMOS's $Q_1$ and $Q_2$ serve as the load MOS's which are cross-coupled, the nMOS's $Q_3$ and $Q_4$ serve as differential transistors, the pMOS $Q_8$ and the nMOS $Q_9$ serve as first switching means, and the pulse signals $\phi_2$ and $\phi_2$NOT are the first control signals.

The differential transistors $Q_3$ and $Q_4$ may be replaced by npn bipolar transistors. Further, either one of the transistor $Q_6$ or $Q_7$ may be used, and either one of the transistor $Q_8$ or $Q_9$ may be used to carry out the operation.

Symbols d, dNOT denote a pair of complementary input signals of a sense amplifier that are read out from a static type memory cell and that have a very small potential difference. The following read cycle is explained with reference to FIG. 2. During a signal transition period, the MOS transistors $Q_6$ and $Q_7$ which minimize a potential difference of complementary input signals are rendered conductive by the pulse signals $\phi_1$NOT and $\phi$, whereby the signals d and dNOT assume the same potential so that the inverting read out operation can be carried out at a high speed. Then, the MOS transistors $Q_8$ and $Q_9$ which minimize a potential difference of complementary output signals are rendered conductive by the pulse signals $\phi_2$NOT and $\phi_2$, so that the complementary output signals D and DNOT assume the same potential, whereby the positive feedback holding operation of the cross-coupled load MOS transistors $Q_1$ and $Q_2$ is weakened, so that the inverting read out operation can be carried out at a high speed. Next, as the pair of complementary signals are read out as designated at d and dNOT from a memory cell, the transistors $Q_6$ and $Q_7$ are rendered non-conductive by changing pulse signals $\phi_1$, $\phi_1$NOT, and the potential difference increases between d and dNOT. Then, the transistors $Q_8$ and $Q_9$ are also rendered non-conductive by changing pulse signals $\phi_2$, $\phi_2$NOT.

Now, consideration is given to a moment at which the time is shifted from $t_1$ to $t_2$ on the time axis in the timing diagram of FIG. 2. At this moment, the potential d drops and the potential dNOT rises, but the nodes $N_1$ and $N_2$ still have the same potential due to $Q_8$ and $Q_9$ being closed. At $t_2$, the drain current of $Q_3$ decreases, the drain current of $Q_4$ increases, so that after $t_2$ when $Q_8$ and $Q_9$ are opened, the potential at the node $N_1$ rises and the potential at the node $N_2$ drops. Hence, the drain current of $Q_1$ increases, the drain current of $Q_2$ decreases, the potential at the node $N_1$ rises and the potential at the node $N_2$ drops. Then, the drain current of $Q_2$ further decreases with a further increase in the drain current of $Q_1$, whereby the potential at the node $N_1$ rises and the potential at the node $N_2$ drops. That is, the positive feedback works on the nodes $N_1$ and $N_2$ of the sense amplifier so that the potential difference is widened quickly, making it possible to realize a sense amplifier that operates at a very high speed.

The differential transistors $Q_3$ and $Q_4$ respond to the complementary input signals d and dNOT, and the load MOS transistors $Q_1$ and $Q_2$ respond to the differential transistors $Q_3$ and $Q_4$. Therefore, the complementary outputs D and DNOT having a large capacitive load are charged or discharged at high speeds.

In the sense amplifier, the transistors $Q_6$, $Q_7$, $Q_8$ and $Q_9$ play very important roles. That is, the complementary input signals d, dNOT and the complementary output signals D, DNOT are short-circuited during a signal transition period that is a first minor portion of a read cycle, such that the signals are quickly moved to transition.

Figure 2:
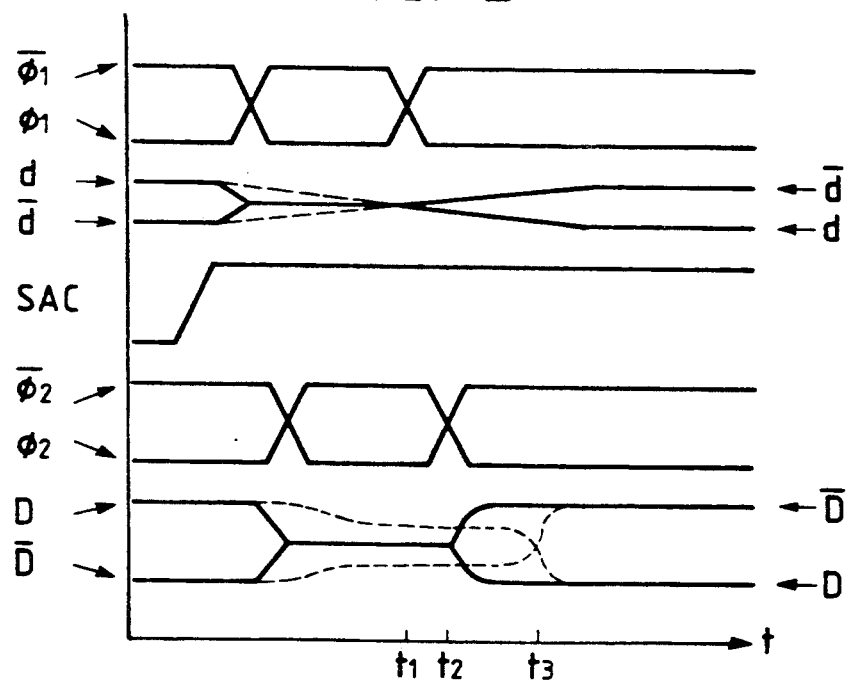
FIG. 2 is a timing diagram illustrating the operation of the circuit of FIG. 1.
Figure 3:
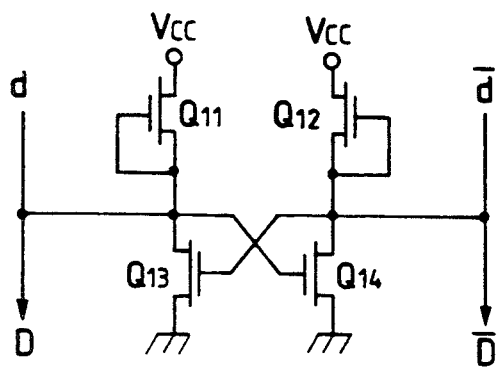
FIGS. 3 and 4 are diagrams of convention circuits.
Figure 4:
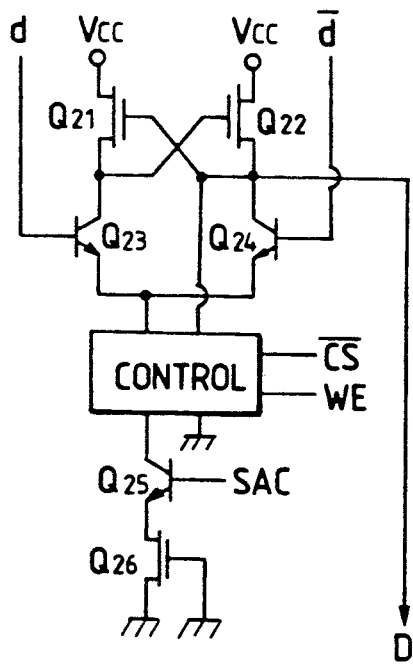

As mentioned previously, there is a strong positive feed back operation of the cross coupled load MOS transistors for both the circuit device of FIG. 4 according to the prior art and the sense amplifier of FIG. 1 according to the present invention. With respect to the FIG. 4 prior art, the differential amplifier employs bipolar transistors that provide a data line swing of about one volt due to the bipolar circuit and the large current driving capability of the bipolar circuit can drive the cross coupled load out of their stable state upon inversion, but MOS technology cannot be employed for the differential transistor in the circuit of FIG. 4, because of the lower driving ability of the MOS transistor compared to the bipolar transistor. Accordingly, it is essential to the present invention that at least the equalization switch $Q_8$, $Q_9$, e.g., be employed for equalizing the data line and effectively initializing the cross coupled load so that inversion can be carried out with the MOS transistor drivers $Q_3$, $Q_4$ even with very small signals on the data lines d, dNOT. That is, the equalization switch $Q_8$, $Q_9$ destroys the feedback operation of the cross coupled PMOS's.

In the prior art, such as equalization switch has only accomplished the function of equalizing the output signals for inversion, but with the present invention, the output data line equalization switch accomplishes the further function of destroying the feedback operation of the cross coupled load for the MOS differential amplifier. Therefore, the cross coupled load differential amplifier of the present invention can be employed with MOS technology. The use of MOS technology is preferred in an integrated circuit over the use of bipolar technology, because of the reduced cost of construction, and the advantages of lower power.

In FIG. 2, broken lines indicate the timings of d, dNOT and D, DNOT when the transistors $Q_6$, $Q_7$, $Q_8$ and $Q_9$ are not used in the circuit of FIG. 1. In this case, quick transition of the complementary output signals D, DNOT is prevented by the action of the positive feedback circuit of load MOS transistors $Q_1$ and $Q_2$; i.e., transition of the signals D, DNOT takes place for the first time at a time $t_3$ after the potential difference of the complementary input signals has increased. That is, the sense speed is greatly delayed. When a maximum potential difference is small between the complementary input signals d and dNOT, transition of the complementary output signals D and DNOT may not take place, i.e., the data may not be correctly read out.

According to this embodiment of FIG. 1 as described above, a pair of complementary input signals having a very small potential difference can be amplified at a very high speed while maintaining a large amplification factor.

Figure 5:
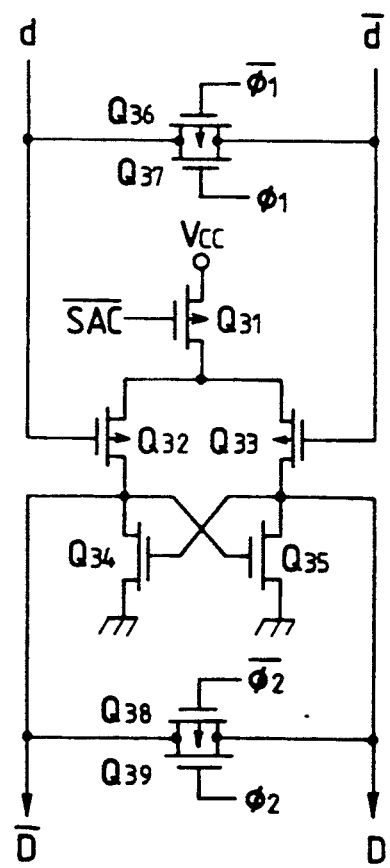
FIGS. 5, 6, 7 and 8 are circuit diagrams illustrating other embodiments of the present invention.

Another embodiment of the present invention is shown in FIG. 5. The embodiment of FIG. 5 is different from the first embodiment (FIG. 1) in that the roles of the pMOS's and the roles of the nMOS's are exchanged, but the circuit of FIG. 5 carries out the amplification operation at a very high speed maintaining a large amplification factor just as in FIG. 1. The pMOS's are $Q_{36}$, $Q_{31}$, $Q_{33}$, $Q_{32}$ and $Q_{38}$. The nMOS's are $Q_{37}$, $Q_{34}$, $Q_{35}$ and $Q_{39}$. Even in this embodiment, either the MOS transistor $Q_{36}$ or $Q_{37}$ may be used, and either $Q_{38}$ or $Q_{39}$ may be used to carry out the desired operation.

Figure 6:
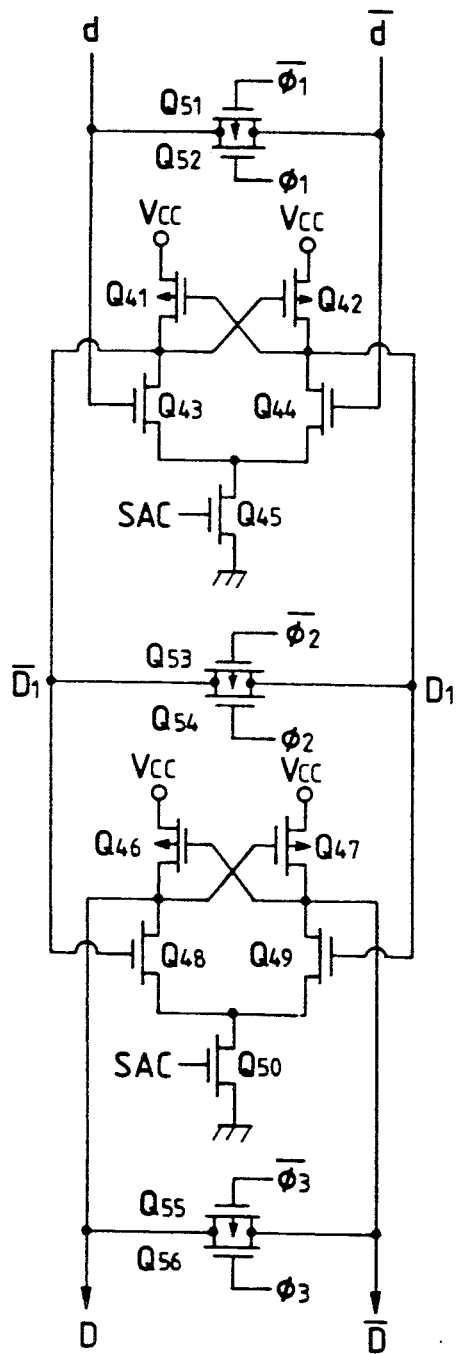

FIG. 6 illustrates a further embodiment of the present invention in which the circuits of FIG. 1 are cascade connected in two stages. With the circuits cascade connected in two stages, the amplification factor can be further increased, and the potential difference between the complementary output signals D and DNOT can be fully widened up to the power source voltage.

With the circuit of FIG. 6, furthermore, when transistors $Q_{46}$ to $Q_{50}$ of an increased size are employed for the sense amplifier of the second stage to reinforce the load drivability, and when large capacitive loads are connected to D and DNOT, the capacitive loads can be driven at high speeds. In structure and function, transistors $Q_{41}$–$Q_{45}$ correspond respectively to transistors $Q_1$–$Q_5$, which also correspond respectively to transistors $Q_{46}$–$Q_{50}$. Switching transistors $Q_{51}$, $Q_{52}$, $Q_{55}$, $Q_{56}$ correspond respectively to switching transistors $Q_6$, $Q_7$, $Q_8$, $Q_9$, and switching transistors $Q_{53}$ and $Q_{55}$ function to equalize the data lines between the amplification stages, under the influence of control signals $\phi_{2NOT}$ and $\phi_2$.

Figure 7:
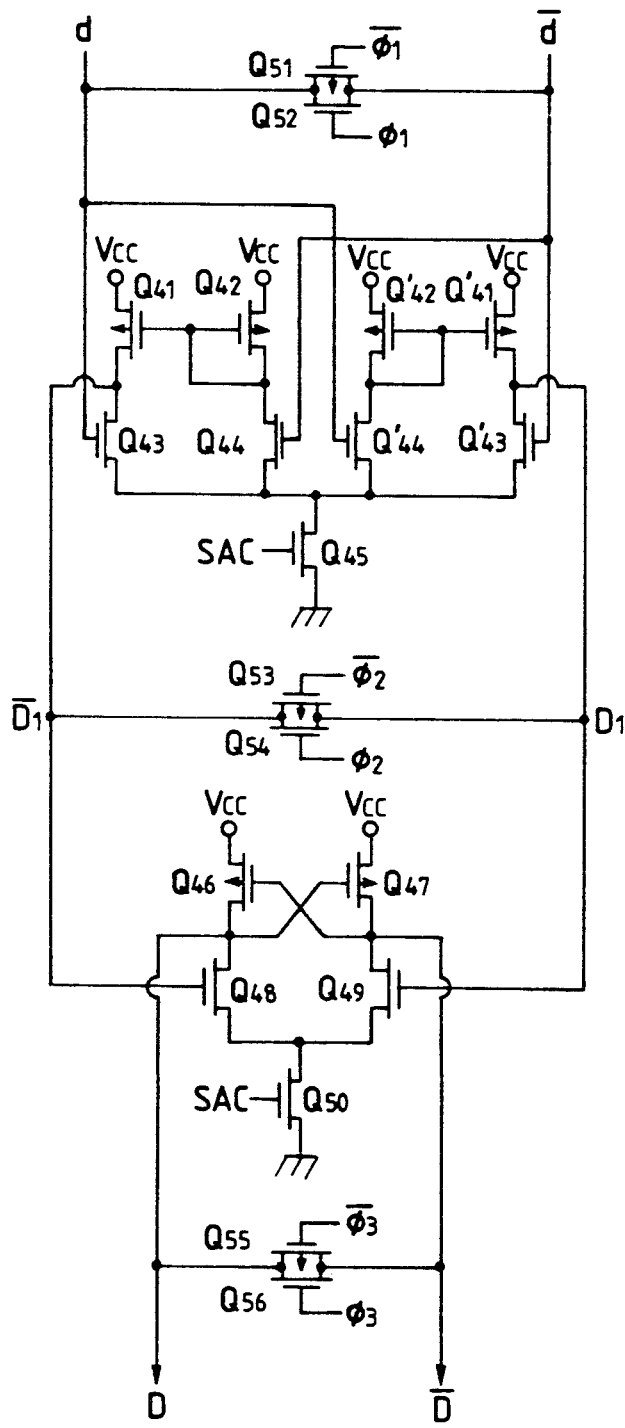

FIG. 7 illustrates a still further embodiment of the present invention. In the circuit of FIG. 7, a well-known sense amplifier consisting of nMOS differential transistors $Q_{43}$, $Q_{44}$, $Q_{43}'$, $Q_{44}'$ and pMOS current mirror transistors $Q_{41}$, $Q_{42}$, $Q_{41}'$, $Q_{42}'$ are placed in the first stage and the circuit of FIG. 1 is used as a sense amplifier of the second stage, the amplifiers being connected in cascade.

All the embodiment circuits of the present invention are specifically related to double ended sense amplifiers, that is sense amplifiers having complimented outputs, D, DNOT. When using a current mirror load, it is necessary to employ two current mirrors to obtain the complimented outputs. While the current mirror load has high speed, its speed is not as high as the second stage of FIG. 7, but the main disadvantage is that 9 transistors are used in the first stage as compared to 5 transistors used in the second stage. When considering all of the data lines, for a memory having a large number of data bits for each word, it can be seen that a difference of 4 transistors per bit can become substantial. While the circuit of FIG. 7 can operate without the switches $Q_{51}$, $Q_{52}$, $Q_{53}$, $Q_{54}$, it cannot operate without the switches $Q_{55}$ and $Q_{56}$.

While the cross coupled positive feed back load is used for the differential amplifier in the second stage for the mentioned advantages of very fast sensing speed, which is the result of the positive feedback, there is an advantage to employing the current mirror load for the first stage. A large equalization timing margin is obtained by using a current mirror amplifier as the first stage amplifier. In order to obtain a high speed of the memory device, it is important to shorten the delay time between the application of the word line pulse to the memory matrix and the output of the data from the sense amplifiers, that is the word-to-output delay. There is also the work-to-equalization ending delay time, which is the time from the application of the word line pulse to the memory and the ending of the equalization of the data lines by the opening of the switches $Q_{51}$, $Q_{52}$, $Q_{53}$, $Q_{54}$, $Q_{55}$, $Q_{56}$. For the current mirror sense amplifier, the work-to-equalization ending delay time has a minimum value that is 1.3 ns less than corresponding minimum value for a cross coupled load sense amplifier, therefore the current mirror is used as the first stage in FIG. 7.

Figure 21:
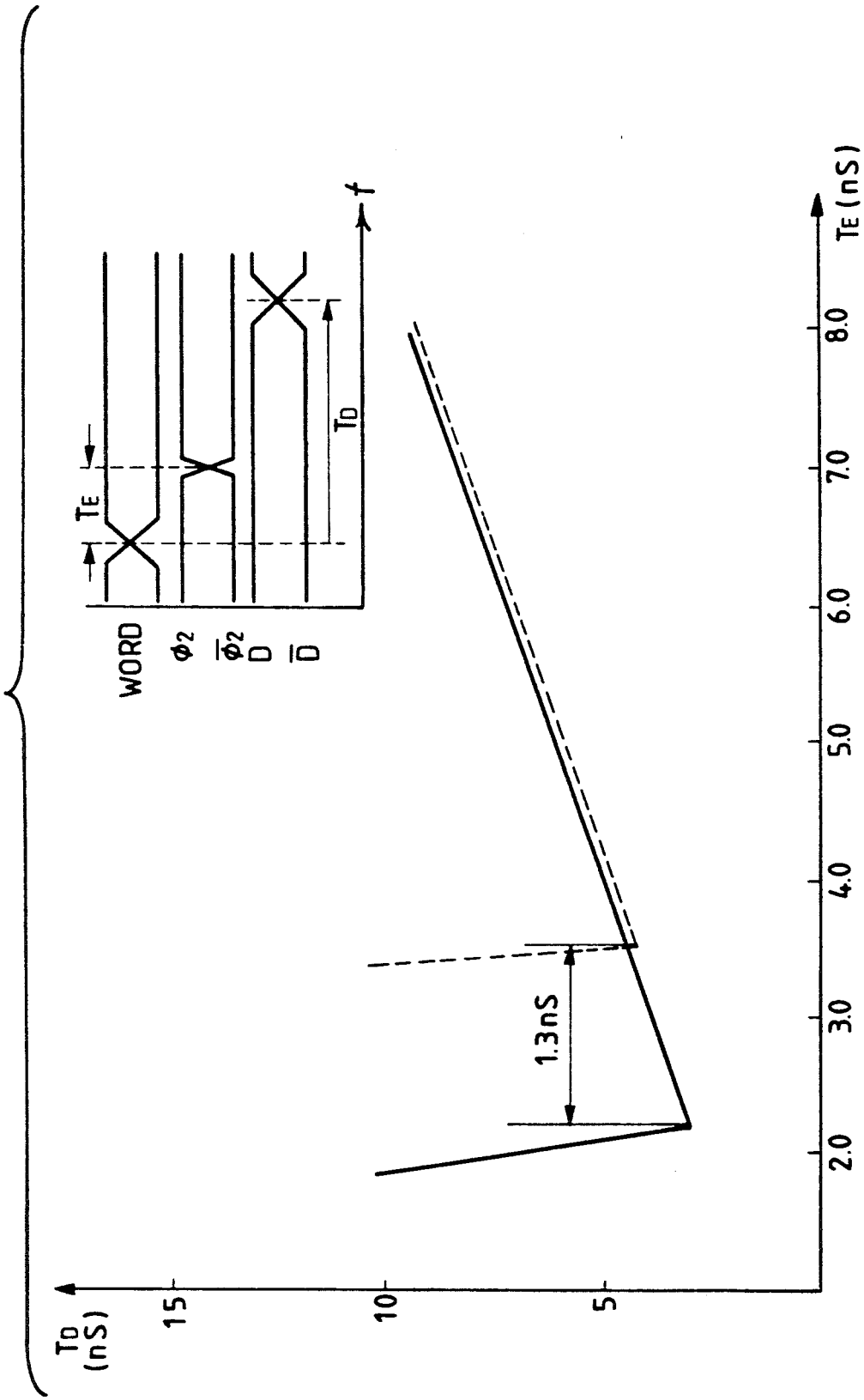
FIG. 21 is a diagram illustrating a difference between the characteristic of the embodiment of FIG. 6 and that of the embodiment of FIG. 7.

The word-to-equalization ending delay $T_E$ is shown by the abscissa of FIG. 21, and the word-to-output delay $T_D$ is shown by the ordinate of FIG. 21.

The solid line in FIG. 21 shows the characteristic of the embodiment of FIG. 7, and the broken line in FIG. 21 shown the characteristic of the embodiment of FIG. 6. In either case, if the word-to-equalization ending delay $T_E$ is too short, due to a difference of characteristic (e.g. threshold voltage) of the differential transistors or the load transistors, erroneous information may be temporarily obtained from outputs of differential transistors in the first stage of the sense amplifier during a time in which the amplitude of the differential input signal to the first stage is minute so that a delay is necessary for obtaining correct information from the outputs of the differential transistors. This delay determines the word-to-output delay $T_D$, predominantly.

Since the amplification factor of the positive feedback load of the first stage of the sense amplifier in the embodiment of FIG. 6 is large, erroneous information is obtained from the outputs of this first stage at a large amplitude. However, since the amplification factor of the current mirror load of the first stage of the sense amplifier in the embodiment of FIG. 7 is small in comparison with that of the positive feedback load in the embodiment of FIG. 6, small amplitude erroneous information may be obtained from the outputs of the first stage so that the word-to-output delay $T_D$ becomes small in the embodiment of FIG. 7. Therefore, the two stage sense amplifier of FIG. 7 can theoretically be operated at 1.3 ns faster than the otherwise identical two stage sense amplifier of FIG. 6.

Figure 8:
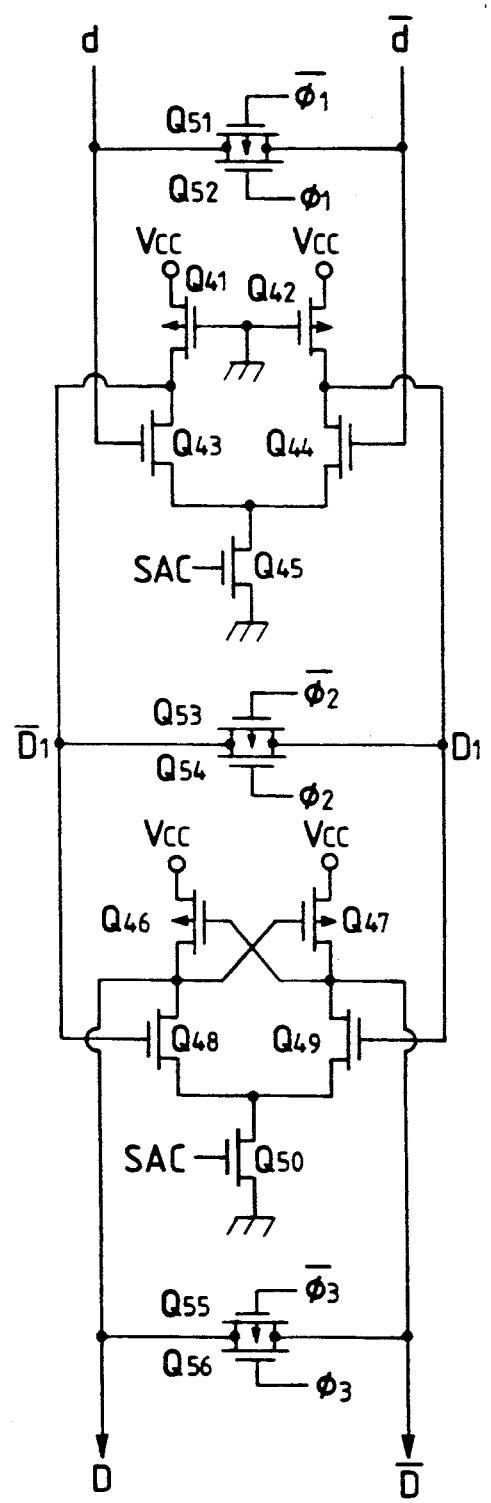

FIG. 8 illustrates a further embodiment of the present invention. In the circuit of FIG. 8, a differential amplifier having drive n MOS's $Q_{43}$, $Q_{44}$ and load pMOS transistors $Q_{41}$, $Q_{42}$ that have a fixed voltage gate, e.g. ground potential, is placed in the first stage, and the circuit of FIG. 1 is used as a sense amplifier in the second stage, with the amplifiers being connected in cascade.

Even in the constitutions of FIGS. 7 and 8, large capacitive loads connected to the data buses, D, DNOT can be driven at high speeds by the positive feedback sense amplifier of the second stage.

Figure 9:
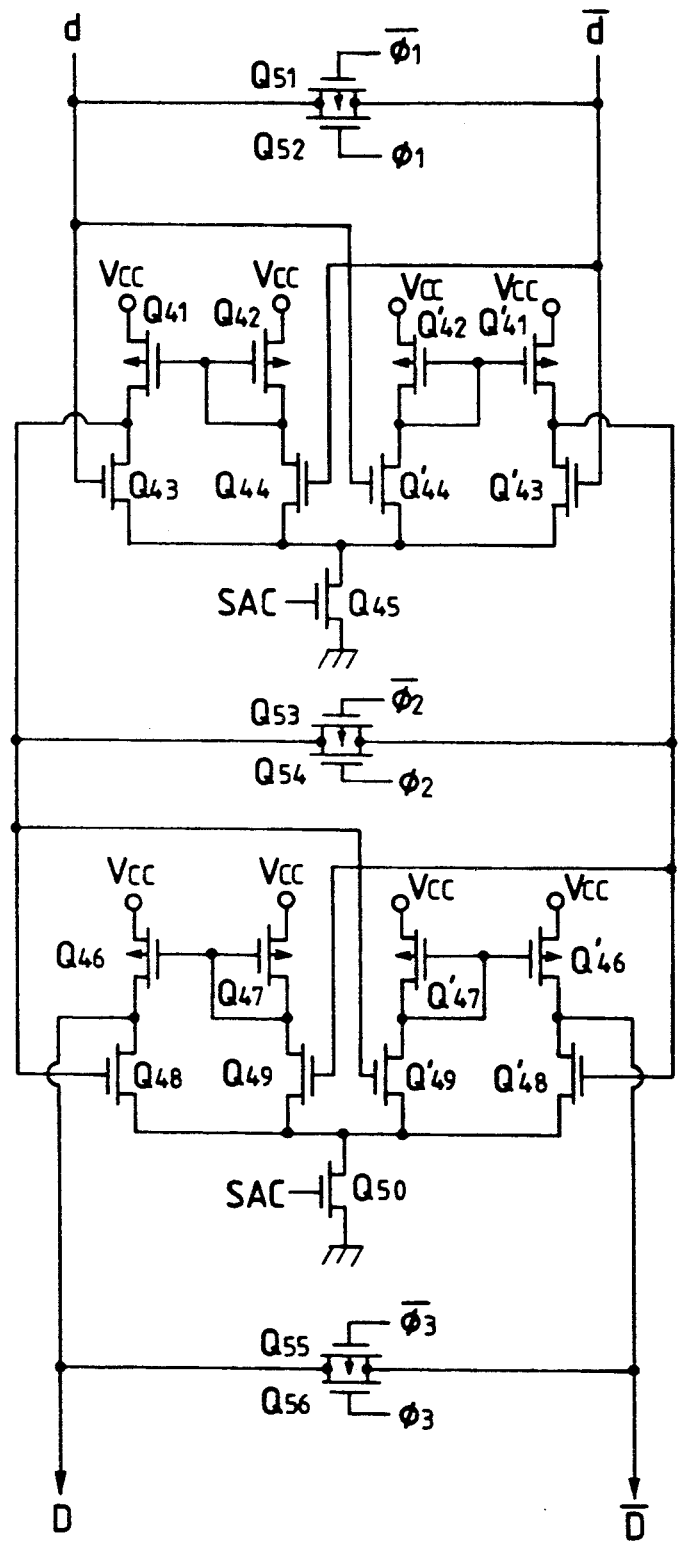
FIG. 9 is a circuit diagram showing a conventional sense circuit.

FIG. 9 shown a simplified portion of a sense circuit of Ohtani et. al, SESSION XIX: High Density SRAMS, pages 264, 265, of the 1987 IEEE International Solid-Stage Circuits Conference, Digest of Technical Papers in which the amplifiers are cascade connected in two stages, each amplifier being made up of two parallel connected current mirror amplifiers. Equalization switches are employed before and after each stage.

Figure 10:
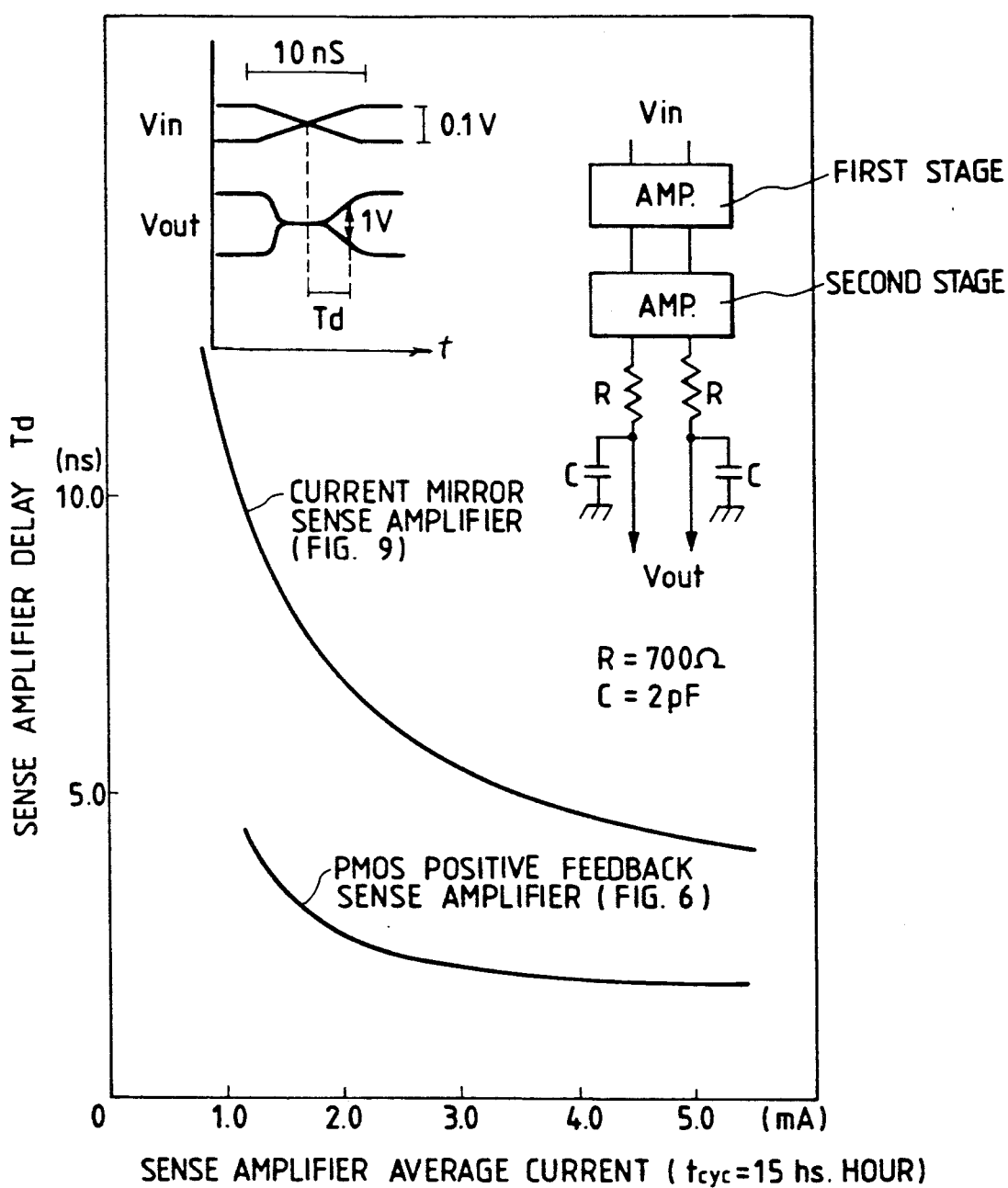
FIG. 10 is a characteristics diagram showing sense amplifier average current dependency on delay time required for the sense amplification by the embodiment of FIG. 6 of the present invention and by the conventional sense circuit of FIG. 9.

FIG. 10 is a graph showing delay times of the sense circuit of FIG. 6 according to an embodiment of the present invention and of the prior art sense circuit of FIG. 9, relative to the sense amplifier average current. It will be obvious from FIG. 10 that the sense circuit of FIG. 6 according to the embodiment of the present invention operates at speeds two or more times as high as the conventional sense circuit of FIG. 9. Looked at in another way, FIG. 10 shows that far less average sense amplifier current is used in the present invention than in FIG. 9 to produce the same delay time.

Figure 11:
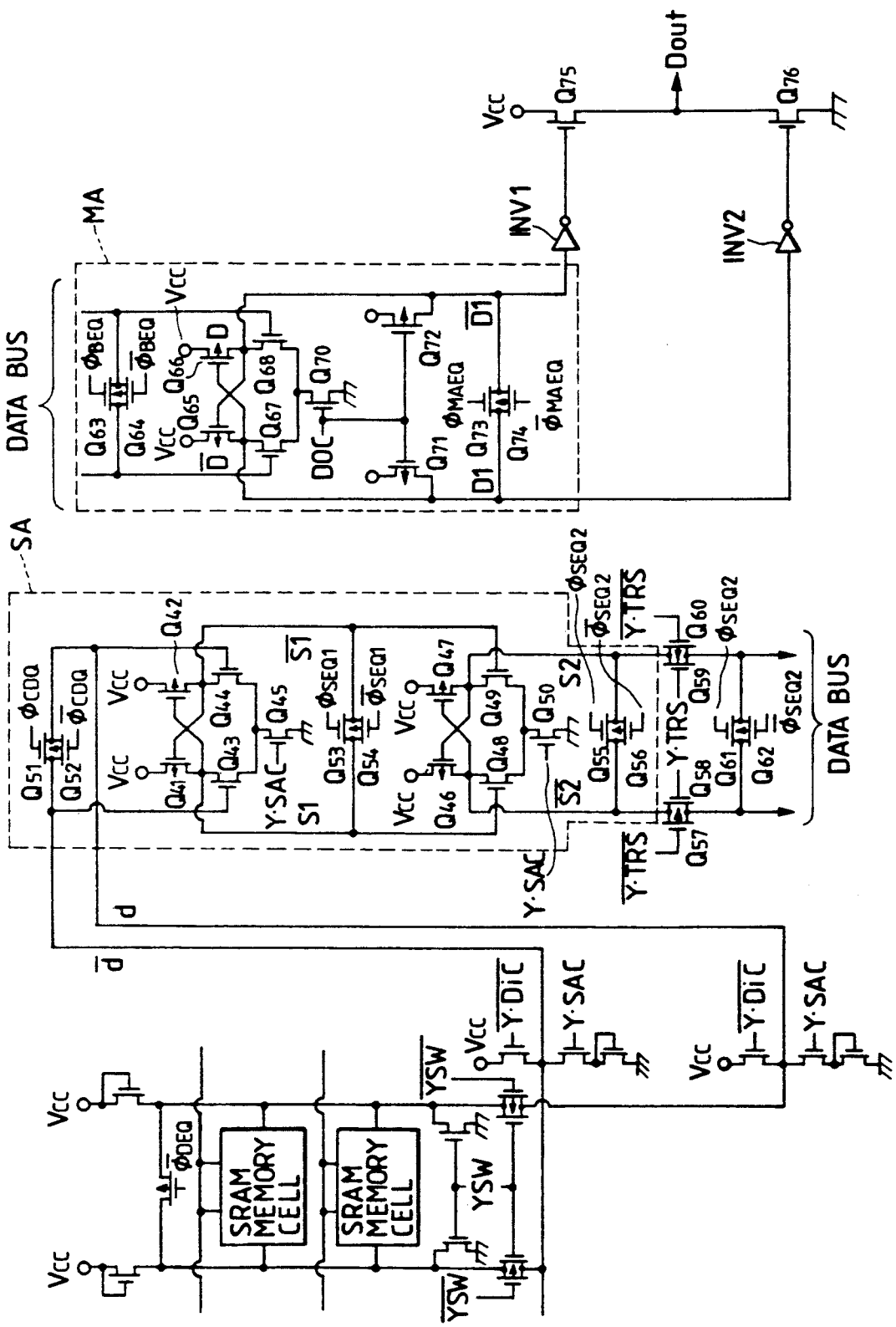
FIG. 11 is a circuit diagram illustrating another embodiment of the present invention.
Figure 12:
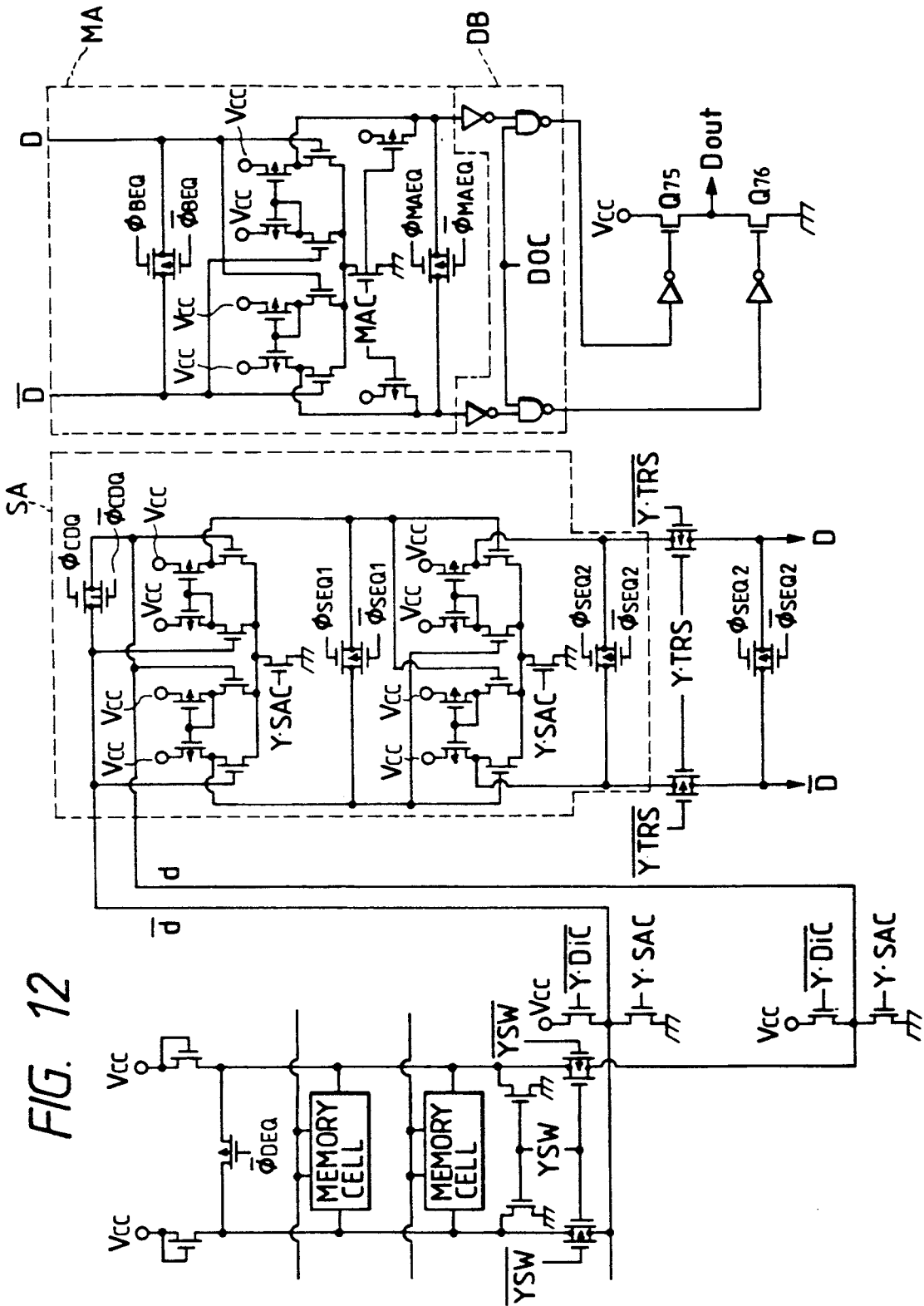
FIG. 12 is a diagram showing the circuit studied by the present inventors as a preliminary part of the present application.

FIG. 11 illustrates a further embodiment of the presnt invention constituting a static random access memory (SRAM). In FIG. 11, the sense amplifier SA of FIG. 6 is employed to amplify the read out signals from the SRAM cells, and a main amplifier MA consists of the sense amplifier of FIG. 1 to which are added pMOS transistors $Q_{71}$ and $Q_{72}$ which control tri-state operation of the main amplifier. FIG. 12 shown an integrated circuit conceived by and studied by the present inventors as a part of the development of the present invention. The embodiment of FIG. 11 has a greatly decreased number of transistors, and requires about half the current consumption and layout area as compared with those of FIG. 12. Using the circuit of FIG. 11, furthermore, the operation speed can be greatly increased and time required for the memory cell data to reach Dout is nearly halved compared with when the circuit of FIG. 12 is used, as is confirmed by the circuit analysis.

The above advantages occur, because in the circuit of FIG. 12, the load pMOS transistors are connected in a current mirror manner and have a small load MOS gain, whereas the load pMOS transistors in the circuit of FIG. 11 are connected in a positive feedback crossing manner and have a large gain.

In FIGS. 11 and 12, portions that have not been explained in detail above include transistors Q75 and Q76 that will be respectively driven by the complementary data outputs to produce a single data line output Dout. The memory matrix is shown to the left of the figures, with respect to SRAM memory cells, by way of example, which are connected to common data lines and have respective word lines. Data lines and the usual MOS circuitry lead to a sense amplifier SA.

Figure 13:
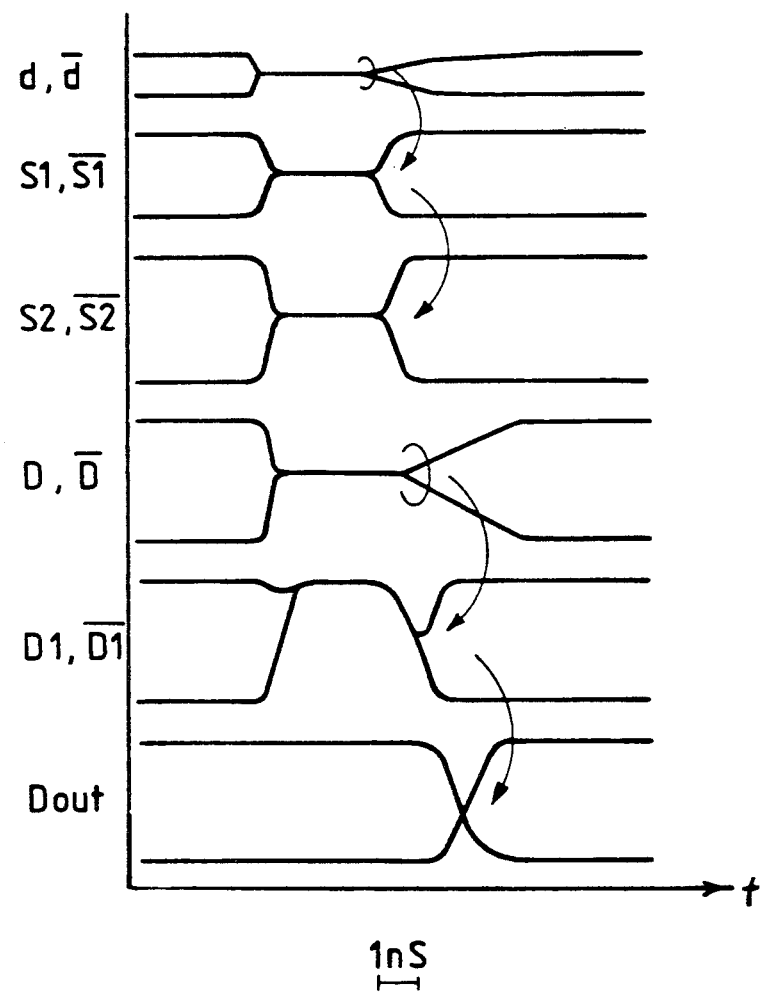
FIG. 13 is a timing diagram of operation waveforms of the embodiment of FIG. 11.

FIG. 13 shown operation waveforms by the circuit analysis conducted when the sense circuit of FIG. 11 is adapted to a 1 M-bit SRAM. In FIG. 13, after equalization a minute potential difference between the common data lines d and dNOT is amplified at a high speed through the sense amplifiers to obtain signals S1, S1NOT (SA in FIG. 11) of the first stage and the second stage obtains signals S2 and S2NOT of the CMOS level. After having propagated through the data buses having large wiring capacitances, the signals S2 and S2NOT exhibit blunt waveforms (D, DNOT in FIG. 13) at the input terminal of the main amplifier (MA in FIG. 11). As soon as a minute potential difference develops in D, DNOT, however, it is amplified through the main amplifier, and main amplifier output signals D1, D1NOT are obtained at high speeds to drive output transistors $Q_{75}$ and $Q_{76}$ via inverters INV1 and INV2. Using the circuit constitution of FIG. 11, as described above, sense amplifiers of the first and second stages and the main amplifier are operated permitting a delay of about 1 ns, and the output Dout is obtained at a very high speed. In the case of FIG. 13, the output Dout is obtained in about 3 ns after a potential difference has developed across the common data lines d and dNOT.

In FIG. 12, furthermore, an output control circuit DB is provided after the main amplifier MA to determine a high impedance condition at the output terminal Dout in response to a data output control signal DOC. In the embodiment of FIG. 11, on the other hand, the activated condition and the non-activated condition of the main amplifier MS are controlled by the nMOS transistor $Q_{70}$ which is controlled by the data output control signal DOC, and the pMOS transistors $Q_{71}$ and $Q_{72}$ that place the output terminal Dout in a high impedance condition are connected in parallel with the output of the main amplifier MA and are controlled by the DOC. Therefore, the circuit corresponding to the output control circuit DB of FIG. 12 is eliminated, and the signal transmission time in the output buffer is shortened.

Figure 14:
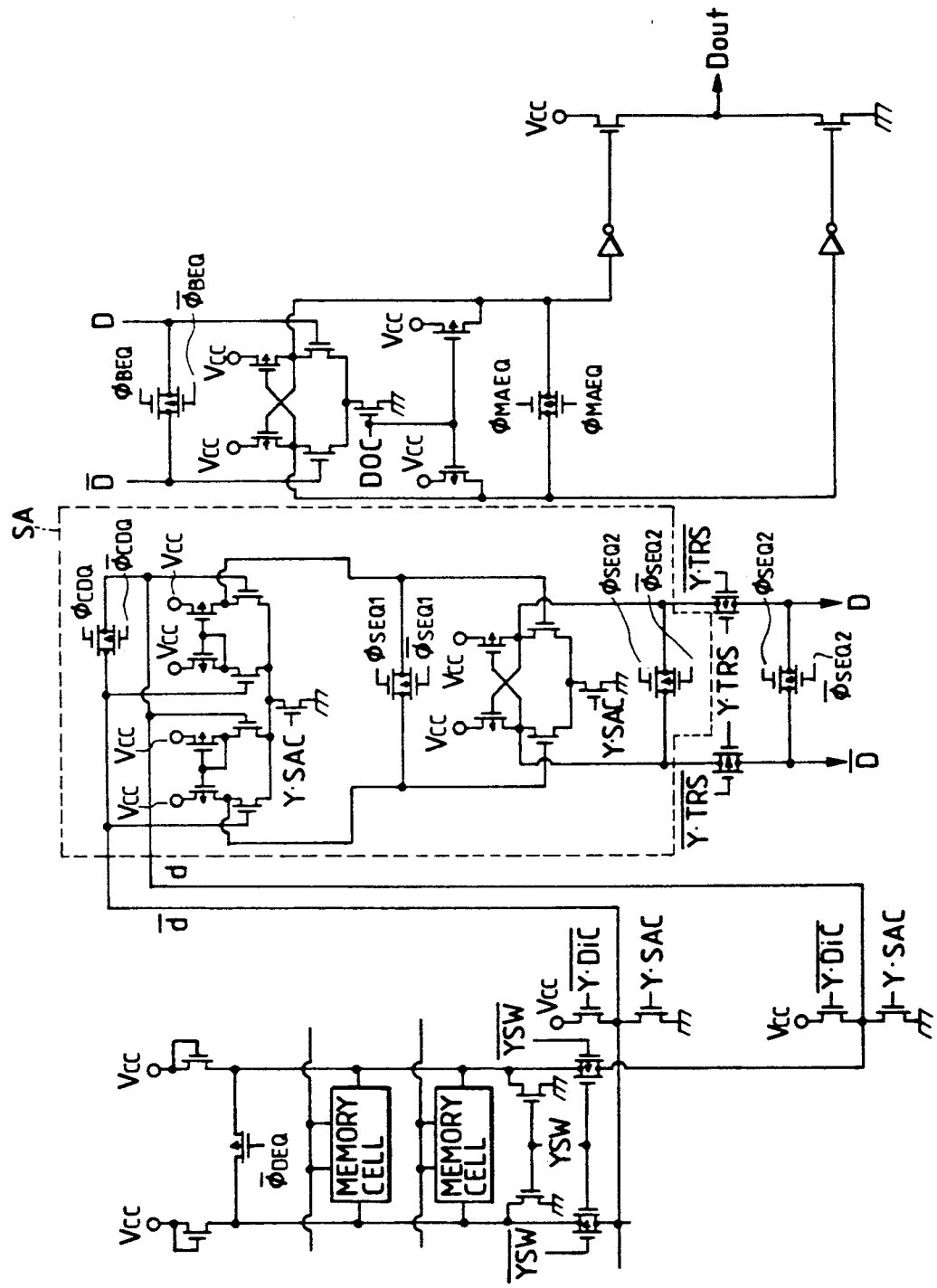
FIGS. 14, 15 and 16 are circuit diagrams illustrating other embodiments according to the present invention.

FIG. 14 illustrates a further embodiment of the present invention in which the sense amplifiers SA of the first and second stages are constituted by using the sense circuit of FIG. 7.

Figure 15:
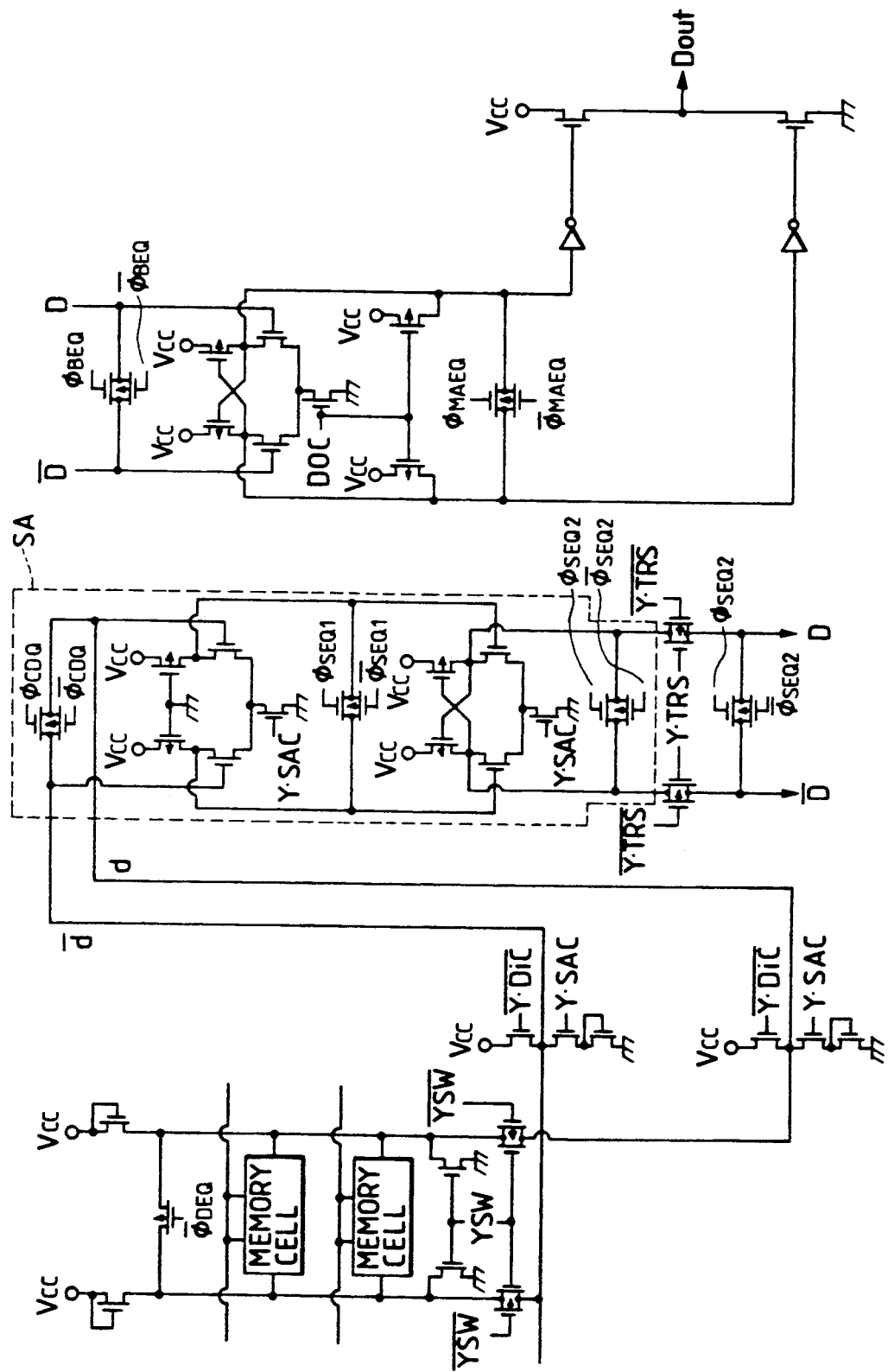

FIG. 15 illustrates another embodiment of the present invention in which the sense amplifiers SA of the first and second stages are constituted by using the sense circuit of FIG. 8.

Figure 16:
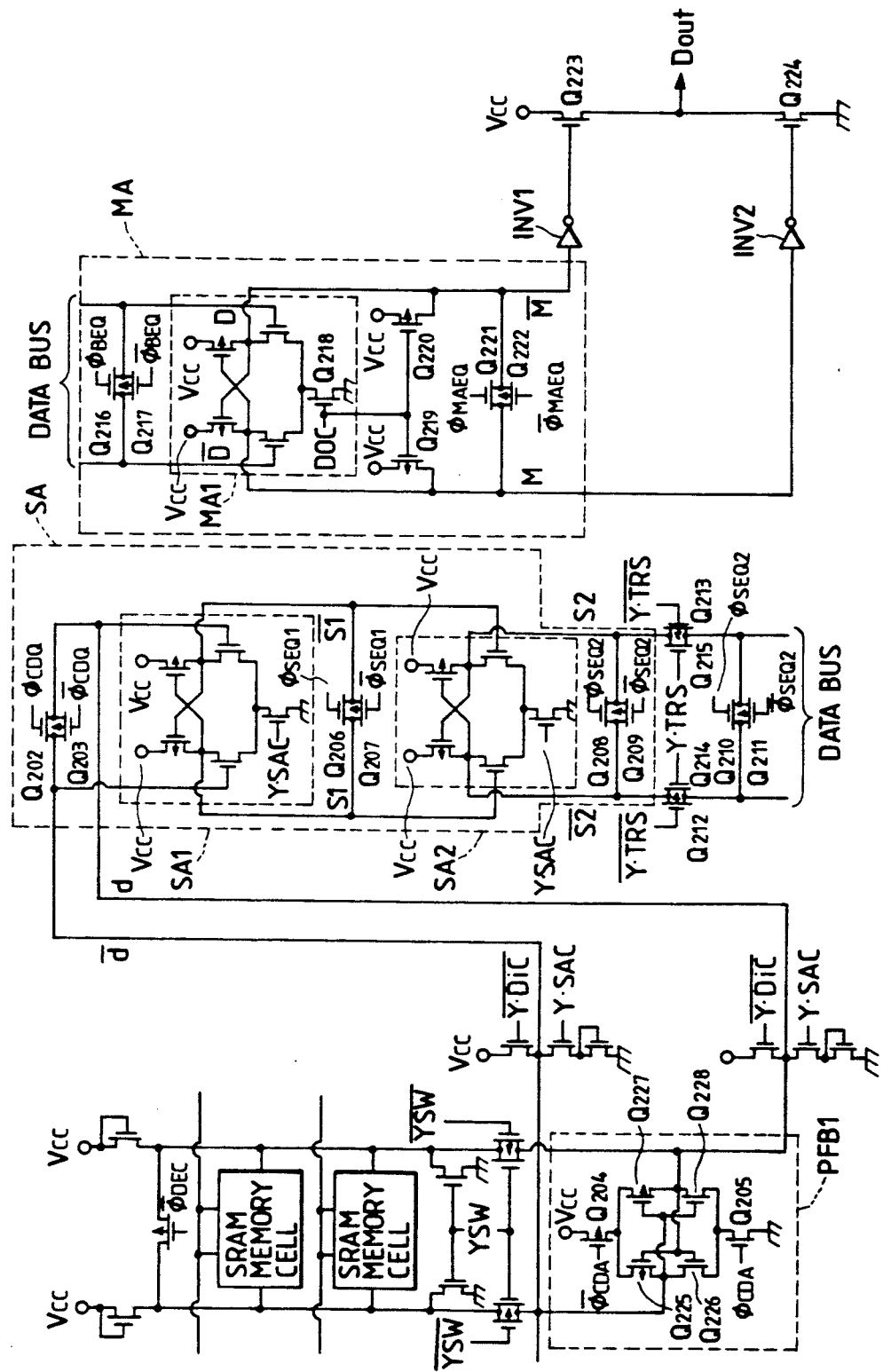
Figure 17:
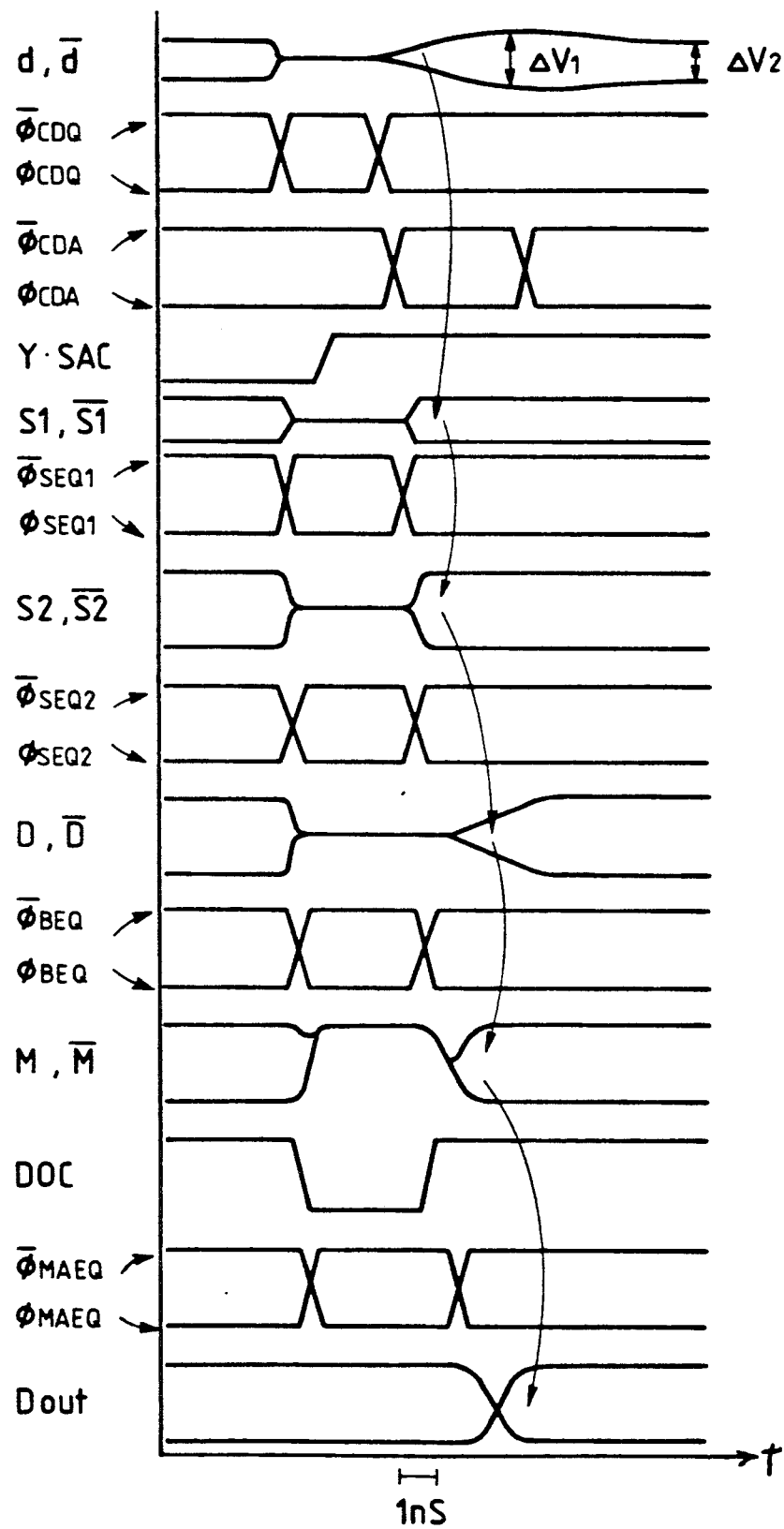
FIG. 17 is a timing diagram of operation waveforms for explaining the operation of the embodiment of FIG. 16.

FIG. 16 shown a further embodiment (sense circuit of the static RAM) according to the present invention which is equivalent to the embodiment of FIG. 11 but in which a CMOS positive feedback preamplifier PFB1 ($Q_{204}$, $Q_{205}$, $Q_{225}$ to $Q_{228}$) is added to the common data lines d and dNOT. FIG. 17 is a diagram of waveforms illustrating the operation of the embodiment of FIG. 16. FIG. 16 will now be explained in conjunction with FIG. 17. The potential difference read out from the static RAM memory cell and transmitted onto the common data lines d, dNOT is usually as small at 0.1 to 0.2 v. The key to high-speed operation is how to amplify this minute potential difference as quickly as possible. A pulse is applied to $\phi_{CDQ}$ and $\phi_{CDQ}$NOT during the signal transition period of d, dNOT to temporarily render the MOD transistors $Q_{202}$, $Q_{203}$ conductive, such that the signals of d, dNOT are quickly equalized. Next, as a signal potential difference develops on d, dNOT due to a newly selected memory cell, the MOS transistors $Q_{204}$ and $Q_{205}$ are rendered conductive by the pulses $\phi_{CDA}$ and $\phi_{CDA}$NOT to operate the CMOS positive feedback pre-amplifier PFB1 in which the input signal line and the output signal line are coupled direct. The PFB1 amplifies the potential difference of d, dNOT by positive feedback to obtain a potential difference ($\Delta V_1$) having a value of a maximum of about 0.5 V. The PFB1 works to increase the potential difference quickly so that the sense circuit of the next stage operates quickly and stably. After the sense operation is finished in the next and subsequent stages, the transistors $Q_{204}$ and $Q_{205}$ are rendered non-conductive by $\phi_{CDA}$ and $\phi_{CDA NOT}$ and the PFB1 does not operate. The sense operation is considered finished when the potential difference coming from the memory cell has been amplified by the entire sense amplifier circuit to an acceptable value, which in the present example is 0.5 volts. However, with the strong amplifier of the present circuit that is used to produce fast operation, after the sense operation is completed, the output signal would continue to be amplified, for example up to 3 or 5 volts or the maximum value of Vcc, which would delay and complicate the inversion process. Therefore, with the present invention, as soon as the output data difference for the complimentary lines of the entire sense amplifier circuit reaches the desired value, the preamplifier is effectively taken out of this circuit, or more broadly speaking its amplification is reduced, more specifically reduced to unity. In this manner, the entire sense amplifying circuit can be designed with very strong amplification for quick sensing, and the amplification can be reduced as soon as the sensing is accomplished so that the desired output is maintained for as long as desired without increasing excessively. Any preamplifier may be used as PFB1, although there are advantages of using a current mirror load circuit for the preamplifier, as the first stage, as previously discussed with respect to reduction of the overall data delay. Further, although the amplification may be reduced in any manner, it is particularly desirable to reduce the amplification of the preamplifier PFB1 to unit. It is most desirable to provide the preamplifier in the circuit such that the input data lines d and dNOT are respectively directly connected to the output data lines of the preamplifier PFB1, independently of the preamplifier, so that the preamplifier may be completely turned off, to draw no current, without turning off the data lines. In this matter, very little power is consumed by the preamplifier PFB1, because it is only on for a small portion of the read cycle, namely the sense portion of the read cycle. The signal read out from the SRAM memory cell via the Y-direction switching MOS transistor after sensing is not amplified by the CMOS positive feedback preamplifier PFB1, but is transmitted onto the common data lines d, dNOT via the direct path between the input signal line and the output signal line of the pre-amplifier PFB1. Thus, the potential difference of d, dNOT does not increase excessively and gradually changes into a steady-stage potential value $\Delta V_2$ (0.1 to 0.2 V). That is, the potential difference between the common data lines d, dNOT does not increase excessively, and read out of the data from the next memory cell is not delayed. Outputs S1, S1NOT of the first-stage sense amplifier (SA1) are transited quickly since the MOS transistors $Q_{206}$ and $Q_{207}$ become conductive during the period of signal transition in response to pulse $\phi_{SEQ1}$, $\phi_{SEQ1 NOT}$ and also outputs S2, S2NOT of the second-stage sense amplifier (SA2) are transited quickly since the MOS transistors $Q_{208}$, $Q_{209}$ become conductive during the period of signal transition in response to $\phi_{SEQ2}$, $\phi_{SEQ2 NOT}$. Thereafter, as a potential difference develops on the common data lines d, dNOT, the transistors $Q_{206}$, $Q_{207}$, $Q_{208}$ and $Q_{209}$ are rendered non-conductive, and the sense amplifiers SA1 and SA2 are operated by a control signal Y.SAC, in order to obtain signals S1, S1NOT, S2 and S2NOT that are amplified at a very high speed owing to the PMOS positive feedback operates as mentioned already.

The MOS transistors $Q_{212}$, $Q_{213}$, $Q_{214}$ and $Q_{215}$ that constitute a transfer gate to connect outputs S2, S2NOT of the second-stage sense amplifier to the data buses, D, DNOT, are rendered conductive before the signals are produced onto S2, S2NOT, and the MOS transistors $Q_{210}$, $Q_{211}$, $Q_{216}$ and $Q_{217}$ are conductive during the period of signal transition in response to pulses $\phi_{SEQ2}$, $\phi_{SEQ2 NOT}$, $\phi_{BEQ}$ and $\phi_{BEQ NOT}$. The transistors $Q_{210}$, $Q_{211}$, $Q_{216}$ and $Q_{217}$ are therefore rendered non-conductive as a potential difference develops between S2 and S2NOT. The signals S2, S2NOT amplified through the second-stage sense amplifier SA2 assume blunt waveforms (D, DNOT in FIG. 17) as they propagate through the data buses having large capacitive loads.

The MOS transistor $Q_{218}$ becomes non-conductive during the period of signal transition in response to the control signal DOC, the transistors $Q_{219}$ and $Q_{220}$ become conductive, and the MOS transistors $Q_{221}$ and $Q_{222}$ become conductive in response to the signals $\phi_{MAEQ}$ and $\phi_{MAEQ NOT}$ such that the potentials M, MNOT of the main amplifier outputs temporarily become equal to the power source voltage Vcc. During this period, therefore, the output nMOS transistors $Q_{223}$ and $Q_{224}$ are both rendered non-conductive. Current which flows piercing through the output transistors $Q_{223}$ and $Q_{224}$ can be suppressed to small amounts during the period in which the output signal $D_{out}$ is transited from "0" to "1" or from "1" to "0", and a low power consumption and low noise operation can be carried out. Next, the transistor $Q_{218}$ is rendered conductive by the DOC signal and the transistors $Q_{219}$, $Q_{220}$ are rendered non-conductive before a potential develops between D and DNOT and, then, the transistors $Q_{221}$ and $Q_{222}$ are rendered non-conductive when a potential difference develops between D and DNOT. Then, signal waveforms M, MNOT are obtained that are amplified at high speeds by the main amplifier MA1. These signal drive the output transistors $Q_{223}$ and $Q_{224}$ via the inverters INV1 and INV2, and whereby an output Dout is obtained.

With a minute potential difference of the common data lines d, dNOT being successively amplified at high speeds as described above, there is obtained an output waveform Dout at a very high speed.

According to a still further embodiment of the invention, a circuit constitution can be contrived by using the circuit of FIG. 7, 8 or 9 as the sense circuits SA of the first stage and second stage of FIG. 16. All of these embodiments produce outputs at high speeds based on the same operations as the ones mentioned earlier.

Figure 18:
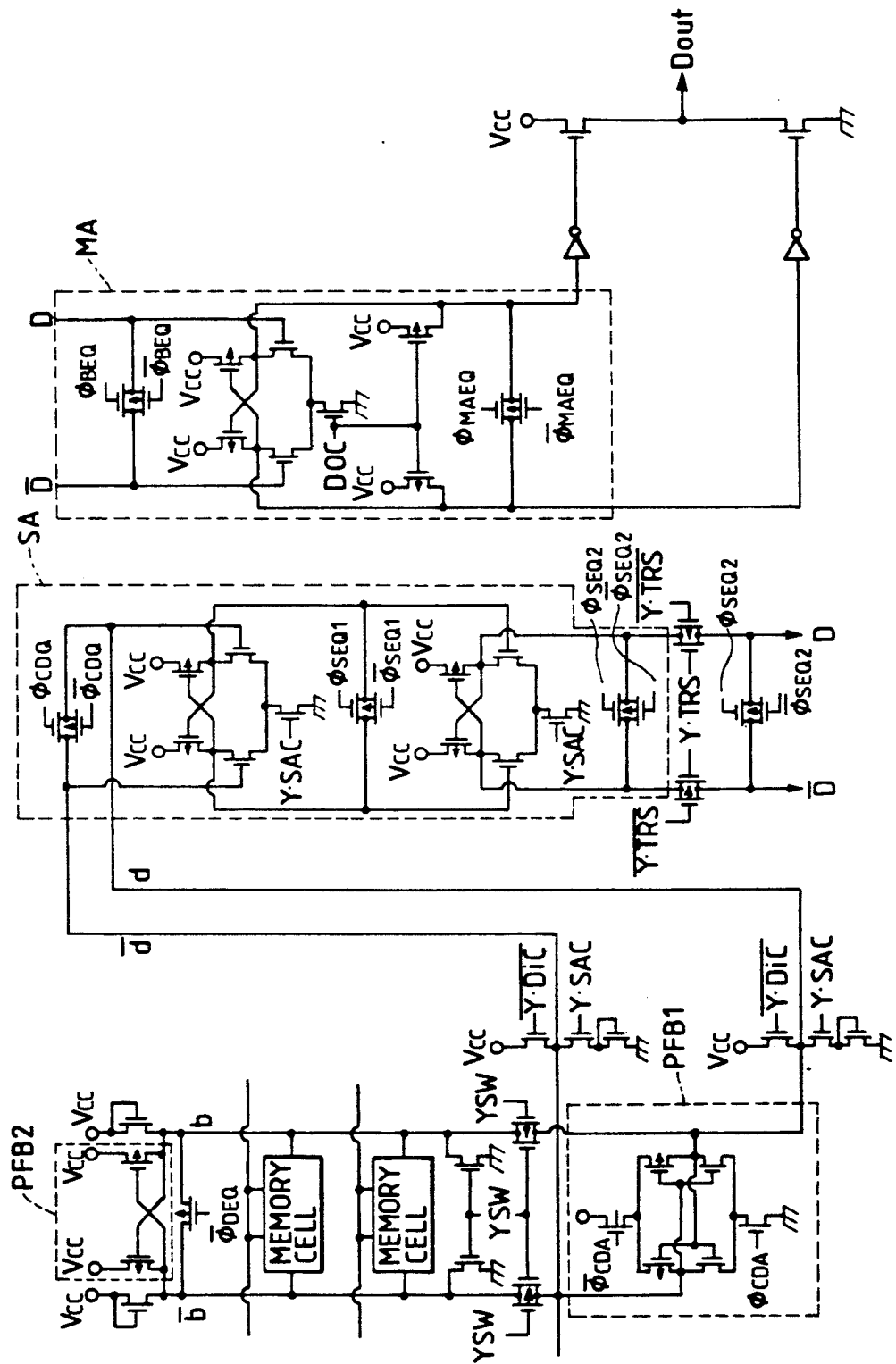
FIG. 18 is a circuit diagram illustrating a further embodiment of the present invention.

FIG. 18 illustrates a further embodiment of the present invention according to which a pMOS positive feedback circuit PFB2 is added to the embodiment of FIG. 16. The PFB2 works to increase the potential difference between the pair of bit lines b and bNOT at a high speed such that a potential difference between the common data lines d and dNOT becomes greater than that of the embodiment of FIG. 16, in order to further increase the operation speed of the sense amplifier SA and to carry out the amplification operation at an increased speed.

Another embodiment of the present invention employs the circuit of FIG. 7, 8 or 9 as the sense circuit SA of the first and second stages of FIG. 18. All of these embodiments make it possible to realize a sense amplifier that operates at high speeds as in that of FIG. 18.

Figure 19:
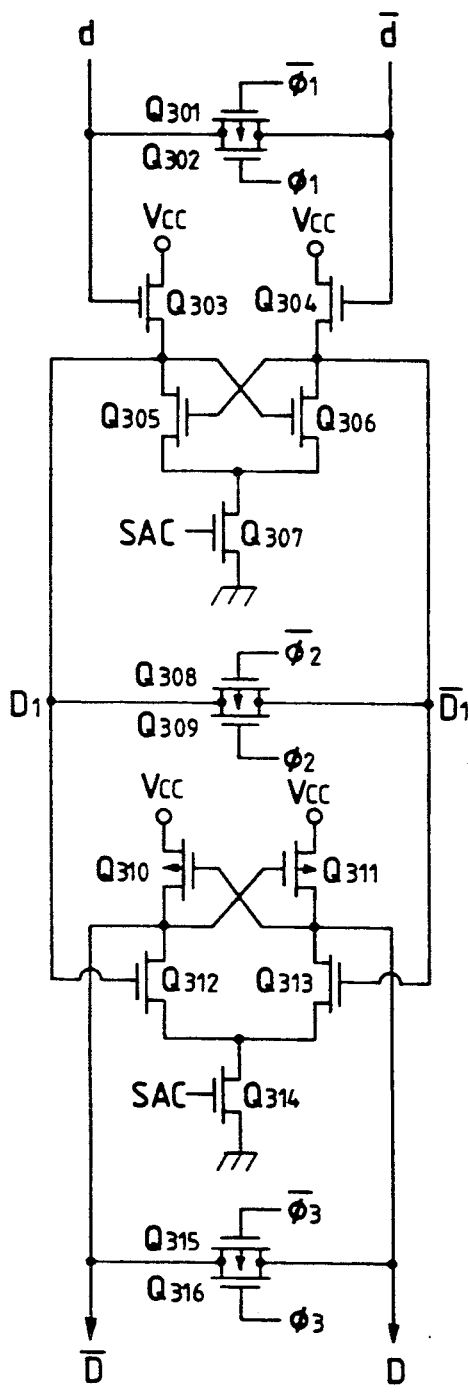
FIGS. 19 and 20 are circuit diagrams illustrating other embodiments according to the present invention.

FIG. 19 illustrates a further embodiment of the present invention. Symbols Q301, Q308, Q310, Q311, and Q315 denote pMOS's; symbols Q302, Q303, Q304, Q305, Q306, Q307, Q309, Q312, Q313, Q314, and Q316 denotes nMOS's. In the circuit of FIG. 19, two different kinds of amplifiers are connected in cascade. The first stage amplifier consists of Q303, Q304, Q305, Q306, and Q307, which are all nMOS's. The circuit of FIG. 1 is used as the second stage amplifier, which consists of Q310, Q311, Q312, Q313, and Q314. First switching transistors Q301 and Q302 are connected between d and dNOT; second switching transistors Q308 and Q309 are connected between D1 and D1NOT; third switching transistors Q315 and Q316 are connected between D and DNOT. A pair of complementary signals D1 and D1NOT are obtained through the pair of transistors Q303 and Q304 according to the input pair signal d and DNOT, and quickly amplified by cross-coupled transistors Q305 and Q306. The pair of signals D1 and D1NOT are quickly amplified again by the second stage amplifier, which drives large capacitive loads at high speed by increasing the transistor sizes of Q310, Q311, Q312, Q313, and Q314.

Figure 20:
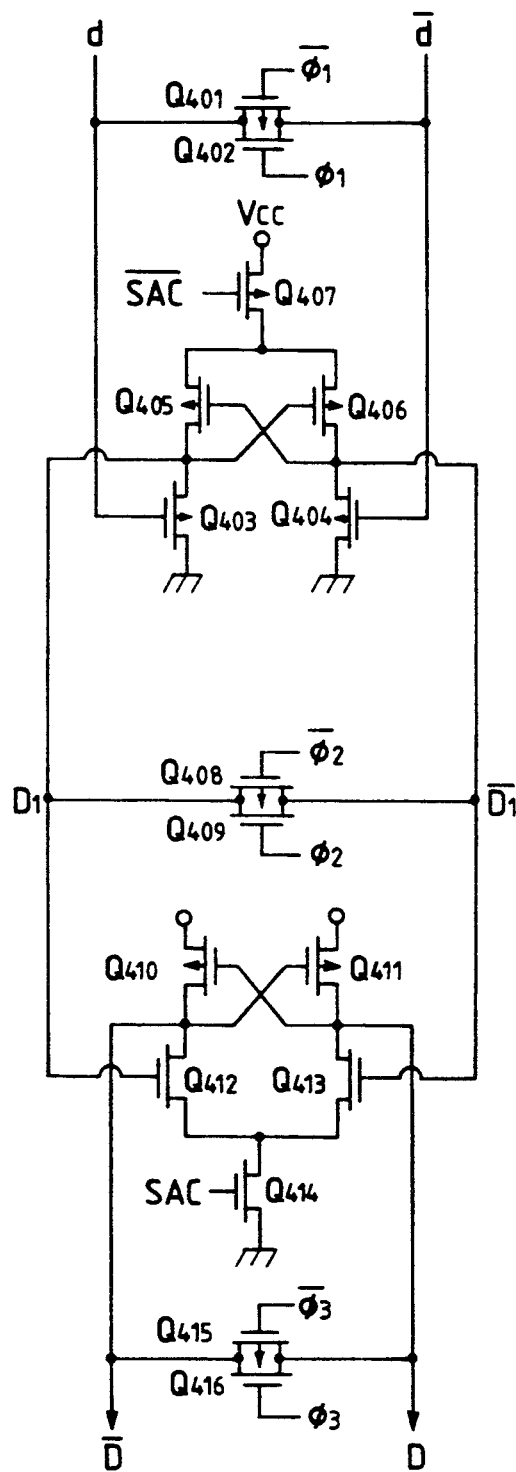

FIG. 20 illustrates a further embodiment of the present invention. Symbols Q402, Q409, Q412, Q413, Q414 and Q416 denote nMOS's; symbols Q401, Q403, Q404, Q405, Q406, Q407, Q408, Q410, Q411, and Q415 denote pMOS's. In the circuit of FIG. 20, two different kinds of amplifiers are connected in cascade. The first stage amplifier consists of Q403, Q404, Q405, Q406, and Q407, which are all pMOS's. The circuit of FIG. 1 is used as the second stage amplifier, which consists of Q410, Q411, Q412, Q413, and Q414. First switching transistors Q401 and Q402 are connected between d and dNOT; second switching transistors Q408 and Q409 are connected between D1 and D1NOT; third switching transistors Q415 and Q416 are connected between D and DNOT. A pair of complimentary signals D1 and D1NOT are obtained through the pair of transistors Q403 and Q404 according to the input pair of signals d and dNOT, and quickly amplified by cross-coupled transistors Q405 and Q406. The pair of signals D1 and D1NOT are quickly amplified again by the second stage amplifier, which drives large capacitive loads at high speed by increasing the transistor sizes of Q410, Q411, Q412, Q413, and Q414.

In FIG. 19 and 20, n-channel MOS transistors Q303, Q304 of the first stage amplifier in FIG. 19 or p-channel MOS transistors Q403, Q404 of the first stage amplifier in FIG. 20 operate as source followers whose voltage amplification factor is less than unity, and cross-coupled n-channel MOS transistors Q305, Q306 of the first stage amplifier in FIG. 19 or p-channel MOS transistors Q405, Q406 of the first stage amplifier in FIG. 20 operate as load circuits for the above source followers, these cross-coupled load circuits Q305, Q306, Q405, Q406 have large voltage amplification factors.

In these embodiments of FIG. 19 and 20, the equalization switch transistor Q308, Q309, Q408, Q409 dissolves the positive feedback operation of the cross-coupled load MOS transistors Q305, Q306, Q405, Q406 in response to the pulse signal $\phi 2$, $\phi 2NOT$ similar to the previous embodiments. The paired transistors Q303, Q304 and Q403, Q404 have the usual source follower configuration advantages of high input impedance, low output impedance in addition to preamplifier advantages explained above with respect to FIG. 7.

Furthermore, the present invention is not limited to the SRAM but can also be adapted to memory devices as a while such as DRAM, PROM, EPROM, and the like.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A memory device, comprising memory cells and a sense amplifier for amplifying signals read out onto data input lines from the memory cells during a read cycle and outputting the amplified signals onto data output lines, wherein said sense amplifier comprises:

a pair of transistors that respectively have complementary gate inputs that are connected to the data input lines to respond to the read out signals on the data input lines, and said pair of transistors further respectively having drain-source paths to provide complementary outputs connected to the data output lines so that the data output lines are separate from and directly unconnected with the data input lines;

first and second load MOS transistors having gates respectively connected to the complementary outputs of said pair of transistors, and having the gates and drains being cross coupled at respective nodes that are connected to the complementary outputs to provide positive feedback;

first switch means connected across said complementary outputs of said pair of transistors and being controlled by a first control signal;

control means providing said first control signal to said first switch means; and in response to said first control signal, said first switch means is rendered conductive during beginning portion of the read cycle to minimize the potential difference of said complementary outputs and to dissolve the positive feedback operation of said first and second load MOS transistors and said first switch means is then rendered non-conductive.

2. A memory device according to claim 1, wherein said load MOS transistors are PMOS, and said pair of transistors are NMOS.

3. A memory device according to claim 1, wherein said load MOS transistors are NMOS, and said pair of transistors are PMOS.

4. A memory device according to claim 1, wherein said pair of transistors consist of third and fourth MOS transistors having a conduction type that is opposite to the conduction type of said first and second load MOS transistors.

5. A memory device according to claim 4, including a second switch means connected across the complementary inputs of said pair of transistors and controlled by a second control signal to minimize the potential difference of said complementary inputs; and control means providing the second control signal to said second switch means during the first portion of the sense portion of the read cycle.

6. A memory device according to claim 4, wherein said first switch means is a fifth PMOS transistor connected across said complementary outputs, and a sixth NMOS transistor connected in parallel with said fifth MOS transistor and across said complementary outputs.

7. A memory device according to claim 6, including a second switch means connected across the complementary inputs of said pair of transistors and controlled by a second control signal to minimize the potential difference of said complementary inputs; and control means providing the second control signal to said second switch means during the first portion of the sense portion of the read cycle.

8. A memory device according to claim 7, wherein said second switch means is a seventh PMOS transistor and an eighth NMOS transistor connected in parallel with each other across said complementary inputs.

9. A memory device according to claim 4, including a second switch means connected across the complementary inputs of said pair of transistors and controlled by a second control signal to minimize the potential difference of said complementary inputs; and control means providing the second control signal to said second switch means during the first portion of the sense portion of the read cycle; and
wherein said control means provides said first control signal a substantial time after said second control signal.

10. A memory device according to claim 1, including a second switch means connected across the complementary inputs of said pair of transistors and controlled by a second control signal to minimize the potential difference of said complementary inputs; and control means providing the second control signal to said second switch means during the first portion of the sense portion of the read cycle.

11. A memory device according to claim 10, including a second switch means connected across the complementary inputs of said pair of transistors and controlled by a second control signal to minimize the potential difference of said complementary inputs; and control means providing the second control signal to said second switch means during the first portion of the sense portion of the read cycle; and
wherein said control means provides said first control signal a substantial time after said second control signal.

12. A memory device according to claim 4, wherein said sense amplifier is serially connected with an additional sense amplifier to constitute a multi-stage sense amplifier circuit.

13. A memory device according to claim 12, wherein said additional sense amplifier is an all MOS circuit having differential transistors and current mirror load transistors, all connected to said data input lines before the first mentioned sense amplifier.

14. A memory device according to claim 1, wherein all of said transistors and said memory cells are constructed as a single chip integrated MOS transistor circuit.

15. A memory device according to claim 12, wherein the first stage of said multi-stage sense amplifier circuit is a sense preamplifier having means responsive to an amplifier control signal to reduce its amplification factor; and control means providing said amplifier control signal to said sense preamplifier for reducing the amplification factor of said sense preamplifier when the data outputs of said sense amplifier circuit reached a sufficient level to indicate the end of the sense portion of the read cycle.

16. A memory device according to claim 15, wherein said sense preamplifier means reduces the amplification factor to unity in response to the amplifier control signal.

17. A memory device according to claim 16, wherein said sense preamplifier is connected across the data input lines so that the sense preamplifier data inputs are directly connected to the sense preamplifier data outputs, and said sense preamplifier is completely turned off to draw no current in response to the amplifier control signal without interrupting the flow of data on the data input lines.

18. A memory device according to claim 1, wherein the sense amplifier is constructed with a load circuit consisting of two cross coupled load MOS transistors and a drive circuit consisting of two MOS differential transistors.

19. A memory device according to claim 18, including a MOS transistor having its drain and source connected in series with said differential and load transistors so that a control signal at its gate will activate and deactivate the sense amplifier and so that the sense amplifier consists of only five MOS transistors in addition to switch means equalizing the data output lines.

20. A memory device according to claim 1, wherein said data input lines are complimentary for each memory cell and sense amplifier.

21. A memory device according to claim 9, wherein said data input lines are complimentary for each memory cell and sense amplifier.

22. A memory device according to claim 13, wherein said data input lines are complimentary for each memory cell and sense amplifier.

23. A memory device according to claim 14, wherein said data input lines are complimentary for each memory cell and sense amplifier.

24. A memory device according to claim 15, wherein said data input lines are complimentary for each memory cell and sense amplifier.

25. A memory device according to claim 19, wherein said data input lines are complimentary for each memory cell and sense amplifier.

26. A memory device operable in a read cycle, comprising:
data input lines;
data output lines;
memory cells connected to said data input lines;
a preamplifier amplifying data signals read out from said memory cells onto said data input lines, said preamplifier having data inputs and data outputs;
a sense amplifier amplifying output signals of said data outputs of said preamplifier, said sense amplifier having data inputs connected to the data input lines and data outputs connected to the data output lines, said sense amplifier data inputs being separate from and directly unconnected with said sense amplifier data outputs so that the data input lines and data output lines are not directly connected;
said preamplifier and said sense amplifier constituting a sense amplifier circuit;

said preamplifier including control means to reduce amplification at a fixed period of time after the start of the read cycle; and said preamplifier being directly connected across the data input lines so that said preamplifier data inputs are directly connected to said preamplifier data outputs.

27. A memory device according to claim 26, including an additional sense amplifier serially connected with said preamplifier to constitute a multi-stage sense amplifier circuit.

28. A memory device according to claim 27, wherein said control means completely turns off said preamplifier to draw no current in response to the amplifier control signal without interrupting the flow of data on the data input lines.

29. A memory device according to claim 28, wherein all of said preamplifier, said sense amplifier and said memory cells are constructed as a single chip MOS integrated circuit.

30. A memory device according to claim 29, wherein said control means is responsive to a control signal to reduce said preamplifier amplification; and further comprising control means providing said control signal to said preamplifier when the data outputs of said sense amplifier circuit reach a sufficient level to indicate the end of the sense portion of the read cycle.

31. A memory device according to claim 30, wherein said control means reduced said preamplifier amplification to unity in response to its control signal.

32. A memory device according to claim 26, wherein all of said preamplifier, said sense amplifier and said memory cells are constructed as a single chip MOS integrated circuit.

33. A memory device according to claim 26, wherein said control means is responsive to a control signal to reduce said preamplifier amplification; and further comprising control means providing said control signal to said preamplifier when the data outputs of said sense amplifier circuit reach a sufficient level to indicate the end of the sense portion of the read cycle.

34. A memory device according to claim 33, wherein said control means reduces said preamplifier amplifications to unity in response to its control signal.

35. A memory device according to claim 34, wherein all of said preamplifier, said sense amplifier and said memory cells are constructed as a single chip MOS integrated circuit.

36. A memory device according to claim 33, wherein all of said preamplifier, said sense amplifier and said memory cells are constructed as a single chip MOS integrated circuit.

37. A memory device, comprising memory cells and a sense amplifier for amplifying signals read out onto data input lines from the memory cells during a read cycle and outputting the amplified signals onto data output lines, wherein said sense amplifier comprises:

a pair of transistors that respectively have complementary gate inputs that are connected to the data input lines to respond to the read out signals on the data input lines, and said pair of transistors further respectively having drain-source paths to provide complementary outputs connected to the data output lines so that the data output lines are separate from and indirectly coupled through said transistors with said data input lines first and second load MOS transistors having gates respectively connected to the complementary outputs of said pair of transistors, and having the gates and drains being cross coupled at respective nodes that are connected to the complementary outputs to provide positive feedback;

a first switch circuit connected across said complementary outputs of said pair of transistors and being controlled by a first control signal;

control circuitry providing said first control signal to said first switch circuit; and in response to said first control signal, said first switch circuit being conductive during a beginning portion of the read cycle to minimize the potential difference of said complementary outputs and to dissolve the positive feedback operation of said first and second load MOS transistors and said first switch circuit is then rendered non-conductive.

38. A memory device according to claim 37, wherein said load MOS transistors are PMOS, and said pair of transistors are NMOS.

39. A memory device according to claim 37, wherein said pair of transistors consist of third and fourth MOS transistors having a conduction type that is opposite to the conduction type of said first and second load MOS transistors.

40. A memory device according to claim 39, including a second switch circuit connected across the complementary inputs of said pair of transistors and controlled in conductivity by a second control signal; and said control circuitry providing the second control signal to said second switch circuit during the beginning of the read cycle.

41. A memory device according to claim 39, wherein said first switch circuit is a fifth PMOS transistor connected across said complementary outputs, and a sixth NMOS transistor connected in parallel with said firth PMOS transistor and across said complementary outputs.

42. A memory device according to claim 41, including a second switch circuit connected across the complementary inputs of said pair of transistors and controlled by a second control signal; and said control circuitry providing the second control signal to said second switch circuit during beginning of the read cycle.

43. A memory device according to claim 42, wherein said second switch circuit is a seventh PMOS transistor and an eighth NMOS transistor connected in parallel with each other across said complementary inputs.

44. A memory device according to claim 39, including a second switch circuit connected across the complementary inputs of said pair of transistors and controlled by a second control signal; and said control circuitry providing the second signal to said second switch circuit during the beginning of the read cycle; and wherein said control circuitry provides said first control signal a substantial time after said second control signal.

45. A memory device according to claim 37, including a second switch circuit connected across the complementary inputs of said pair of transistors and controlled by a second control signal; and said control circuitry providing the second control signal to said second switch circuit during the beginning of the read cycle.

46. A memory device according to claim 37, including a second switch circuit connected across the complementary inputs of said pair of transistors and controlled by a second control signal; and said control circuitry providing the second control signal to said second switch circuit during the beginning of the read cycle; and wherein said control circuitry provides said first control signal a substantial time after said second control signal.

47. A memory device according to claim 39, wherein said sense amplifier is serially connected with an additional sense amplifier to constitute a multi-stage sense amplifier.

48. A memory device according to claim 47, wherein said additional sense amplifier is an all MOS circuit having differential transistors and current mirror load transistors, all connected to said data input lines before the first mentioned sense amplifier.

49. A memory device according to claim 37, wherein all of said transistors and said memory cells are constructed as a single chip integrated MOS transistor circuit.

50. A memory device according to claim 47, wherein the first stage of said multi-stage sense amplifier is a sense preamplifier responsive to an amplifier control signal to reduce its amplification factor; and including control circuitry providing said amplifier control signal to said sense preamplifier for reducing the amplification factor of said sense preamplifier when the data outputs of said sense amplifier circuit reached a sufficient level to indicate the end of the sense portion of the read cycle.

51. A memory device according to claim 50, wherein said sense preamplifier reduces the amplification factor to unity in response to the amplifier control signal.

52. A memory device according to claim 51, wherein said sense preamplifier is connected across the data input lines so that the sense preamplifier data inputs are directly connected to the sense preamplifier data outputs, and said sense preamplifier completely turns off to draw no current in response to the amplifier control signal without interrupting the flow of data on the data input lines.

53. A memory device according to claim 37, wherein the sense amplifier is constructed with a load circuit consisting of two cross coupled load MOS transistors and a drive circuit consisting of two MOS differential transistors.

54. A memory device according to claim 53, including a MOS transistor having its drain and source connected in series with said differential and load transistors so that a control signal at its gate will activate and deactivate the sense amplifier and so that the sense amplifier consists of only five MOS transistors in addition to switch circuit equalizing the data lines.

55. A memory device according to claim 37, wherein said data input lines are complimentary for each memory cell and sense amplifier.

56. A memory device according to claim 44, wherein said data input lines are complimentary for each memory cell and sense amplifier.

57. A memory device according to claim 48, wherein said data input lines are complimentary for each memory cell and sense amplifier.

58. A memory device according to claim 49, wherein said data input lines are complimentary for each memory cell and sense amplifier.

59. A memory device according to claim 50, wherein said data input lines are complimentary for each memory cell and sense amplifier.

60. A memory device according to claim 54, wherein said data input lines are complimentary for each memory cell and sense amplifier.

61. A memory device operable in a read cycle, comprising:

data input lines:
data output lines;
memory cells connected to said data lines;
a preamplifier amplifying data signals read out from said memory cells onto said data lines, said preamplifier having data inputs and data outputs;
a sense amplifier amplifying output signals of said data outputs of said preamplifier, said sense amplifier having data inputs connected to the data input lines and data outputs connected to the data output lines, said sense amplifier data inputs being separate from and directly unconnected with said sense amplifier data outputs so that the data input lines and data output lines are not directly connected;
said preamplifier and said sense amplifier constituting a sense amplifier circuit;
said preamplifier including control circuitry to reduce amplification at a fixed period of time after the start of the read cycle; and
said preamplifier being directly connected across the data lines so that said preamplifier data inputs are directly connected to said preamplifier data outputs.

62. A memory device according to claim 61, including an additional sense amplifier serially connected with said preamplifier to constitute a multi-stage sense amplifier circuit.

63. A memory device according to claim 62, wherein said control circuitry completely turns off said preamplifier to draw no current in response to the amplifier control signal without interrupting the flow of data on the data input lines.

64. A memory device according to claim 63, wherein all of said preamplifier, said sense amplifier and said memory cells are constructed as a single chip MOS integrated circuit.

65. A memory device according to claim 64, wherein said control circuitry is responsive to a control signal to reduce said preamplifier amplification; and further comprising control circuitry providing said control signal to said preamplifier when the data outputs of said sense amplifier circuit reach a sufficient level to indicate the end of the sense portion of the read cycle.

66. A memory device according to claim 65, wherein said control circuitry reduces said preamplifier amplification to unity in response to its control signal.

67. A memory device according to claim 61, wherein all of said preamplifier, said sense amplifier and said memory cells are constructed as a single chip MOS integrated circuit.

68. A memory device according to claim 61, wherein said control circuitry is responsive to a control signal to reduce said preamplifier amplification; and further comprising control circuitry providing said control signal to said preamplifier when the data outputs of said sense amplifier circuit reach a sufficient level to indicate the end of the sense portion of the read cycle.

69. A memory device according to claim 68, wherein said control circuitry reduces said preamplifier amplification to unity in response to its control signal.

70. A memory device according to claim 69, wherein all of said preamplifier, said sense amplifier and said memory cells are constructed as a single chip MOS integrated circuit.

71. A memory device according to claim 68, wherein all of said preamplifier, said sense amplifier and said memory cells are constructed as a single chip MOS integrated circuit.

* * * * *